United States Patent
Ito et al.

(10) Patent No.: US 8,642,234 B2
(45) Date of Patent: Feb. 4, 2014

(54) PHOTOSENSITIVE RESIN, CURABLE RESIN COMPOSITION CONTAINING THE SAME, DRY FILM THEREOF, AND PRINTED CIRCUIT BOARD USING THEM

(75) Inventors: Nobuhito Ito, Hiki-gun (JP); Masao Arima, Hiki-gun (JP); Syouji Nishiguchi, Isesaki (JP); Kouji Ogawa, Isesaki (JP); Masayuki Kobayashi, Isesaki (JP); Atsushi Sakamoto, Isesaki (JP)

(73) Assignees: Taiyo Holdings Co., Ltd., Tokyo (JP); Showa Denko K.K., Tokyo (JP)

( * ) Notice: Subject to any disclaimer, the term of this patent is extended or adjusted under 35 U.S.C. 154(b) by 104 days.

(21) Appl. No.: 13/231,498

(22) Filed: Sep. 13, 2011

(65) Prior Publication Data
US 2012/0061128 A1 Mar. 15, 2012

(30) Foreign Application Priority Data

Sep. 14, 2010 (JP) ................. 2010-205680

(51) Int. Cl.
G03C 1/72 (2006.01)
G03C 1/73 (2006.01)
G03C 1/00 (2006.01)
C08F 2/46 (2006.01)
C08J 3/28 (2006.01)
C08G 63/195 (2006.01)
C08G 63/193 (2006.01)

(52) U.S. Cl.
USPC ....... 430/18; 430/269; 430/285.1; 430/286.1; 430/287.1; 430/280.1; 522/107; 522/108; 522/104; 522/135; 522/134; 522/144; 522/146; 525/451; 525/502; 525/507; 525/508

(58) Field of Classification Search
USPC ......... 522/107, 108, 135, 134, 144, 146, 168, 522/170; 430/18, 280.1, 285.1, 286.1, 430/287.1; 525/451, 502, 507, 508
See application file for complete search history.

(56) References Cited

U.S. PATENT DOCUMENTS

| | | | |
|---|---|---|---|
| 5,009,982 A | 4/1991 | Kamayachi et al. |
| 5,948,514 A | 9/1999 | Komori et al. |
| 6,893,784 B2 | 5/2005 | Kohiyama et al. |

FOREIGN PATENT DOCUMENTS

| | | | |
|---|---|---|---|
| CN | 101421672 A | 4/2009 |
| JP | 61-243869 | 10/1986 |
| JP | 3-71137 | 3/1991 |
| JP | 3-250012 | 11/1991 |
| JP | 3-253093 | 11/1991 |
| JP | 9-54434 | 2/1997 |
| JP | 11-288091 | 10/1999 |
| JP | 2000-122277 | 4/2000 |
| JP | 3964326 | 6/2007 |
| JP | 2008-001882 | 1/2008 |
| KR | 10-2003-0033075 | 4/2003 |

OTHER PUBLICATIONS

Office Action issued on Apr. 1, 2013 in the corresponding Korean Patent Application No. 10-2011-91710 (with Partial English Translation).
Chinese Office Action dated Jul. 23, 2013, in Chinese Patent Application No. 201110273150.6 (with its partial English translation).

*Primary Examiner* — Sanza McClendon
(74) *Attorney, Agent, or Firm* — Oblon, Spivak, McClelland, Maier & Neustadt, L.L.P.

(57) ABSTRACT

A carboxyl group-containing photosensitive resin is obtained by reacting an α,β-ethylenically unsaturated group-containing monocarboxylic acid (c) with a phenolic compound (a) containing the structure represented by the following general formula (I) and having at least two phenolic hydroxyl groups in its molecule, wherein part or the whole of the phenolic hydroxyl groups being modified into an oxyalkyl group, and further reacting a polybasic acid anhydride (d) with the resultant reaction product;

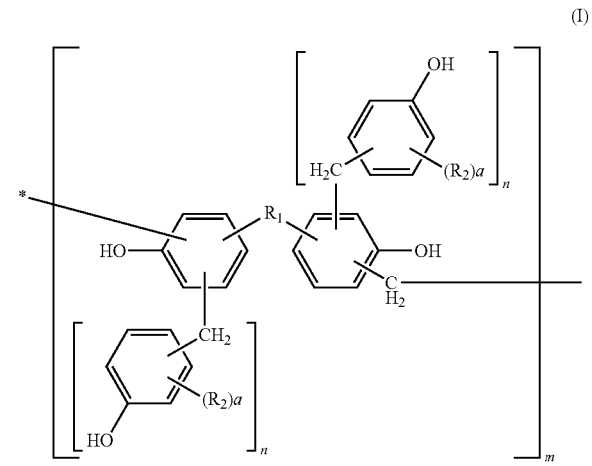

(I)

wherein $R_1$ represents either one of a hydrocarbon radical of 1 to 11 carbon atoms, a $SO_2$ group, an oxygen atom and sulfur atom, $R_2$ represents a hydrocarbon radical of 1 to 11 carbon atoms, "a" represents an integer of 0 to 3, "n" represents an integer of 1 to 2, and "m" represents an integer of 1 to 10.

7 Claims, No Drawings

PHOTOSENSITIVE RESIN, CURABLE RESIN COMPOSITION CONTAINING THE SAME, DRY FILM THEREOF, AND PRINTED CIRCUIT BOARD USING THEM

BACKGROUND OF THE INVENTION

1. Field of the Invention

This invention relates to a carboxyl group-containing photosensitive resin obtained by addition reaction of a phenolic resin having a particular structure with a cyclic ether group-containing compound, such as an alkylene oxide and a cyclic carbonate, and the subsequent addition of an α,β-ethylenically unsaturated group-containing monocarboxylic acid and the addition of a polybasic acid anhydride thereto, of which cured product excels in resistance to heat and toughness, exhibits high hardness and flexibility, and enjoys high water resistance and resistance to chemicals.

This invention further relates to an alkali-developable and curable resin composition containing such a carboxyl group-containing photosensitive resin, a dry film thereof, and a printed circuit board containing a cured product obtained therefrom. More particularly, this invention relates to a liquid alkali-developable, photocurable and thermosetting resin composition which is suitable for use as a permanent mask to be used in the manufacture of usual printed circuit boards, flexible printed circuit boards, and tape carrier packages, interlaminar insulating layers for multi-layer circuit boards, and the like and capable of forming a cured film excelling in adhesiveness, resistance to soldering heat, resistance to moisture absorption, resistance to PCT (pressure cooker test), resistance to electroless gold plating, flexing resistance, folding endurance, flexibility, warpage, and electrical insulating properties by means of a procedure comprising the steps of irradiating a coating film of the composition with ultraviolet light, developing the exposed film with a dilute aqueous alkali solution, thereby forming an image on the film, and finally curing the film by heating, or by irradiation with active or actinic energy rays and subsequent heating, or by heating and subsequent irradiation with active energy rays.

2. Description of the Prior Art

At present, as a solder resist for part of the household grade printed circuit boards and for virtually all the industrial grade printed circuit boards, a liquid developing type solder resist which is irradiated with ultraviolet light and then developed to form an image and thereafter finally cured (finish curing) by heating or exposure to light is adopted from the viewpoint of ensuring highly accurate formation of circuits with high density. Further, with due respect to the problem of environmental safety, the liquid solder resist of the alkali developing type which implements development with a dilute aqueous alkali solution as a developer has come to play the leading role. As such alkali developing type solder resists using a dilute aqueous alkali solution, for example, published Japanese Patent Application, JP 61-243869A discloses a solder resist composition comprising a photosensitive resin obtained by addition of an acid anhydride to a reaction product of a novolak type epoxy compound with an unsaturated monobasic acid, a photopolymerization initiator, a diluent, and an epoxy compound, JP 3-253093A discloses a solder resist composition comprising a photosensitive resin obtained by addition of an acid anhydride to a reaction product of a novolak type epoxy compound with an unsaturated monobasic acid, a photopolymerization initiator, a diluent, a vinyltriazine or a mixture of vinyltriazine with dicyandiamide, and a melamine resin, and JP 3-71137A and JP 3-250012A disclose a solder resist composition comprising a photosensitive resin obtained by addition of (meth)acrylic acid to an epoxy resin resulting from the reaction of epichlorohydrin with a reaction product of salicylaldehyde and monovalent phenol and subsequent addition of a polybasic carboxylic acid or anhydride thereof to the resultant resin, a photopolymerization initiator, an organic solvent, etc.

As mentioned above, some material systems are heretofore proposed as a solder resist and currently used in large quantities in the practical manufacture of printed circuit boards. However, in view of high densification of the printed circuit board to cope with the recent trend of electronic devices toward decreasing weight and size, the desirability of producing the solder resist having high performance has been finding growing recognition. Furthermore, the IC packages using a printed circuit board having the solder resist applied thereto and a sealing resin are recently used instead of the IC packages called QFP (quad flat-pack package), SOP (small outline package), etc. which use a lead frame and a sealing resin. These new packages have such structure that metals such as ball-like solder are arranged in an area on one side of a printed circuit board having the solder resist applied thereto, the IC chips are directly connected thereto on the other side by wire bonding or through the medium of the bumps etc., and they are sealed by a sealing resin. They are called by mnemonic names, such as BGA (ball grid array) and CSP (chip scale package). These packages have more pins than other packages such as QFP of the same size, but are easier to miniaturize. Moreover, also in mounting the devices, they realize a low percent defective owing to the self-alignment effect of ball-like solder, and the introduction of these packages is advanced quickly.

In the printed circuit boards having the heretofore commercially available alkali development type solder resist, however, the PCT resistance which is the long-term reliability test of a package is inferior, which results in exfoliation of a cured film. Moreover, another matter which comes into question is the so-called popcorn phenomenon, i.e. the phenomenon that the moisture absorbed in the solder resist boils within the package during re-flow of the package at the step of mounting of devices and cracks occur in the solder resist film and the circumference thereof inside the package. Such problems in resistance to moisture absorption and long-term reliability are undesirable not only in the case of the above-mentioned mounting technology but also in the products for other uses, such as a solder resist of a usual printed circuit board, a solder resist to be used in the manufacture of a flexible printed circuit board and a tape carrier package, and an interlaminar insulating layer of a multi-layer circuit board like a build-up board.

As mentioned above, the recent advance of the electric industry and semiconductor industry requires more improvement in the characteristics such as, for example, heat resistance, toughness, flexibility, water resistance, and resistance to chemicals. In order to satisfy such demands, various new photosensitive resins are developed.

Heretofore, the photosensitive resin originating from the novolak type epoxy resin as a starting material is widely used in many fields of electronic material, such as a solder resist and an etching resist, owing to its outstanding adhesiveness, heat resistance, resistance to chemicals, electric insulation, etc. As a carboxyl group-containing photosensitive resin having particularly outstanding heat resistance, the above-mentioned resin obtained by causing a polybasic acid anhydride to react with a reaction product of a cresol novolak type epoxy resin and an unsaturated group-containing monocarboxylic acid (JP 61-243869A) is widely used. This resin is excellent in heat resistance. However, this resin has the drawback of being easy to generate cracks by the thermal shock because it causes large shrinkage during curing and exhibits low elongation and poor toughness.

As photosensitive resins which will solve such problems, a photosensitive prepolymer which is a reaction product of a bisphenol type epoxy resin having side chains of which hydroxyl groups is partially epoxidized, a (meth)acrylic acid, and a polybasic acid anhydride (JP 9-54434A), an unsaturated group-containing polycarboxylic resin obtained by causing a tetrahydrophthalic anhydride to react with a reaction product of a cresol novolak type epoxy resin, acrylic acid, and p-hydroxyphenethyl alcohol (JP 11-288091A), etc. are proposed. However, these resins are also still insufficient to satisfy both the heat resistance and toughness.

Furthermore, there is proposed a carboxyl group-containing photosensitive resin obtained by modifying a novolak resin with an alkylene oxide and then adding a (meth)acrylic acid and further a polybasic acid anhydride to the resultant reaction product (Japanese patent No. 3964326). Although this resin exhibits excellent long-term reliability, there is much room for improvement in drying characteristics of ink after application thereof.

SUMMARY OF THE INVENTION

The present invention has been made in view of the problems mentioned above and has an object to provide a carboxyl group-containing photosensitive resin capable of obtaining an ink composition excelling in drying characteristics in addition to good various properties, such as heat resistance, resistance to moisture, and adhesiveness.

A further object of the present invention is to provide an alkali-developable, liquid curable resin composition capable of forming a cured film which excels in such properties as adhesiveness, resistance to soldering heat, resistance to moisture absorption, PCT resistance, and electrical insulating properties required of a solder resist of a usual printed circuit board, a solder resist to be used in the manufacture of a flexible printed circuit board and a tape carrier package, an interlaminar insulating layer of a multi-layer circuit board such as a build-up board, and the like, particularly such properties as resistance to moisture absorption and PCT (pressure cooker test) resistance required of an IC package, and capable of coping with high densification and surface mounting of a printed circuit board.

To accomplish the objects mentioned above, the present invention provides a carboxyl group-containing photosensitive resin obtained by reacting an α,β-ethylenically unsaturated group-containing monocarboxylic acid (c) with a phenolic compound (a) containing the structure represented by the following general formula (I) and having at least two phenolic hydroxyl groups in its molecule, wherein part or the whole of the phenolic hydroxyl groups being modified into an oxyalkyl group, and further reacting a polybasic acid anhydride (d) with the resultant reaction product.

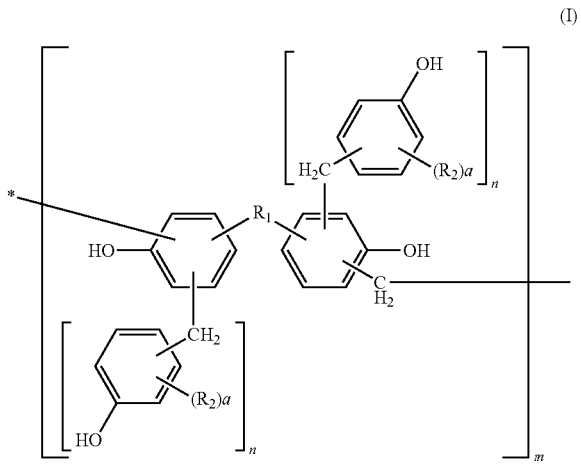
(I)

In the formula, $R_1$ represents either one of a hydrocarbon radical of 1 to 11 carbon atoms, a $SO_2$ group, an oxygen atom and a sulfur atom, $R_2$ represents a hydrocarbon radical of 1 to 11 carbon atoms, "a" represents an integer of 0 to 3, "n" represents an integer of 1 to 2, and "m" represents an integer of 1 to 10.

In accordance with the present invention, there is further provided an alkali-developable, curable resin composition characterized by comprising (A) a carboxyl group-containing photosensitive resin obtained by reacting an α,β-ethylenically unsaturated group-containing monocarboxylic acid (c) with a phenolic compound (a) containing the structure represented by the above-mentioned general formula (I) and having at least two phenolic hydroxyl groups in its molecule, wherein part or the whole of the phenolic hydroxyl groups being modified into an oxyalkyl group, and further reacting a polybasic acid anhydride (d) with the resultant reaction product, (B) a photopolymerization initiator, and (C) a thermosetting component.

The present invention further provides a curable film obtained by applying the above-mentioned curable resin composition on a film and drying it, a cured product obtained by curing the above-mentioned curable resin composition or the above-mentioned curable film by irradiation with active energy rays and/or heating, particularly a cured product obtained by photocuring the above-mentioned curable resin composition or the above-mentioned curable film on copper, and a cured product obtained by photocuring the above-mentioned curable resin composition or the above-mentioned curable film in a predetermined pattern.

According to the present invention, there is also provided a printed circuit board having a cured film obtained by curing the above-mentioned curable resin composition or the above-mentioned curable film by irradiation with active energy rays and/or heating.

The carboxyl group-containing photosensitive resin of the present invention is capable of improving drying characteristics of an ink composition before curing thereof owing to the use of the phenolic compound (a) containing the structure represented by the above-mentioned general formula (I) and having at least two phenolic hydroxyl groups in its molecule, i.e. a novolak type phenolic resin of the particular structure, and has improved flexibility attained by the modification of part or the whole of the phenolic hydroxyl groups of this resin into an oxyalkyl group having an alcoholic hydroxyl group. Further, an α,β-ethylenically unsaturated group and a carboxyl group are imparted to the side chain terminals thereof by the subsequent addition of an α,β-ethylenically unsaturated group-containing monocarboxylic acid (c) and the addition of a polybasic acid anhydride (d) to the end hydroxyl groups of the oxyalkyl groups caused by the modification mentioned above. As a result, the resin has improved reactivity and allows the production of a cured product having well-balanced heat resistance and toughness at a high level, excelling in hardness and flexibility, and exhibiting outstanding water resistance and resistance to chemicals. Further, since the resin has end carboxylic groups, it allows the development with an aqueous alkali solution.

Accordingly, the alkali-developable, curable resin composition containing the aforementioned carboxyl group-containing photosensitive resin (A) together with a photopolymerization initiator (B) and a thermosetting component (C) is preferably used in the formation of a solder resist of a printed circuit board, a solder resist to be used in the manufacture of a flexible printed circuit board and a tape carrier package, an interlaminar insulating layer for a multi-layer circuit board, such as a build-up board, and exhibits excellent drying characteristics, developing properties with an alkali solution, photocuring properties, and thermosetting properties. When its coating film is selectively exposed to light, developed, and finally cured, there is obtained a cured product excelling in various properties, such as adhesiveness, resistance to soldering heat, resistance to moisture absorption, PCT resistance, and electrical insulating properties.

DETAILED DESCRIPTION OF THE INVENTION

The present inventors, after pursuing a diligent study to solve the problems mentioned above, have found that a carboxyl group-containing photosensitive resin (A) obtained by the addition reaction of a cyclic ether group-containing compound (b), such as an alkylene oxide and a cyclic carbonate compound, to part or the whole of the phenolic hydroxyl groups of a phenolic compound (a) containing the structure represented by the above-mentioned general formula (I) and having at least two phenolic hydroxyl groups in its molecule, for example a novolak type phenolic resin of a particular structure obtained by reacting a phenolic compound with a polymethylolated or polyhydroxymethylated bisphenol, the subsequent addition of an α,β-ethylenically unsaturated group-containing monocarboxylic acid (c) to the alcoholic hydroxyl groups of the oxyalkyl groups introduced by the reaction mentioned above and further addition of a polybasic acid anhydride (d) to the resultant reaction product, particularly a carboxyl group-containing photosensitive resin (A) obtained by the use of acrylic acid and/or methacrylic acid as the α,β-ethylenically unsaturated group-containing monocarboxylic acid (c) and an alicyclic dibasic acid anhydride as the polybasic acid anhydride, excels in drying characteristics, developing properties, photocuring properties, and thermosetting properties and allows the production of a cured product having excellent heat resistance and toughness in combination. The present inventors have further found that a cured product obtained from a curable resin composition containing the aforementioned carboxyl group-containing photosensitive resin (A) together with a photopolymerization initiator (B) and a thermosetting component (C) or further with a photosensitive (meth)acrylate compound has the aforementioned excellent properties required of a resist. As a result, the present invention has been perfected.

Specifically, the carboxyl group-containing photosensitive resin (A) of the present invention is capable of improving drying characteristics of the resin composition before curing thereof owing to the use of the phenolic compound containing the structure represented by the above-mentioned general formula (I) and having at least two phenolic hydroxyl groups in its molecule, i.e. a novolak type phenolic resin of the particular structure of which main skeleton contains a small amount of low-molecular-weight moiety, and has improved flexibility attained by the modification of part or the whole of the phenolic hydroxyl groups of this resin into an oxyalkyl group having an alcoholic hydroxyl group. Further, by the subsequent reaction of the α,β-ethylenically unsaturated group-containing monocarboxylic acid (c) and further addition of the polybasic acid anhydride (d) to the end hydroxyl groups of the oxyalkyl groups introduced by the modification mentioned above as the side chains, the α,β-ethylenically unsaturated group and the carboxyl group introduced are not present in the same side chain and located in the terminals of respective side chains. Therefore, the resin excels in reactivity, has high heat resistance and toughness, and exhibits excellent alkali-developability owing to the presence of the end carboxyl groups away from the main chain. Furthermore, since the resin has no hydrophilic secondary hydroxyl group of low reactivity unlike the conventionally used resin of epoxy acrylate modified with an acid anhydride, it allows the production of a cured product excelling in water resistance and resistance to chemicals.

Accordingly, the liquid curable resin composition containing the aforementioned carboxyl group-containing photosensitive resin (A) together with a photopolymerization initiator (B) and a thermosetting component (C) or further with a photosensitive (meth)acrylate compound exhibits excellent drying characteristics, alkali-developability, photocuring properties, and thermosetting properties. When its coating film is selectively exposed to light, developed, and finally cured, there is obtained a cured product excelling in adhesiveness, resistance to soldering heat, resistance to moisture absorption, PCT resistance, and electrical insulating properties.

Now, the carboxyl group-containing photosensitive resin of the present invention and the components of the curable resin composition containing it will be described in detail below.

First, the carboxyl group-containing photosensitive resin (A) of the present invention is obtained by the addition reaction of the cyclic ether group-containing compound (b), such as an alkylene oxide and a cyclic carbonate compound, to part or the whole of the phenolic hydroxyl groups of the phenolic compound (a) containing the structure represented by the above-mentioned general formula (I) and having at least two phenolic hydroxyl groups in its molecule, i.e. the novolak type phenolic resin of the particular structure obtained by reacting a phenolic compound with a polymethylolated or polyhydroxymethylated bisphenol, the subsequent esterification reaction of the α,β-ethylenically unsaturated group-containing monocarboxylic acid (c) to the alcoholic hydroxyl groups of the oxyalkyl groups introduced by the reaction mentioned above and further reaction of the polybasic acid anhydride (d) to the resultant reaction product, as mentioned above. Each reaction is easily carried out in a solvent or in the absence of solvent by the use of a catalyst as described hereinbelow.

It is desirable that such a carboxyl group-containing photosensitive resin (A) should have an acid value in the range of 30 to 150 mg KOH/g, preferably 50 to 120 mg KOH/g. If the acid value of the carboxyl group-containing photosensitive resin is less than 30 mg KOH/g, it will be deficient in solubility in an aqueous alkali solution and the coating film formed therefrom will be developed only with difficulty. Conversely, the acid value exceeding 150 mg KOH/g is not preferred because the coating film will be developed even in the surface of the exposed part without reference to the conditions of the exposure.

The above-mentioned phenolic compound (a) containing the structure represented by the above-mentioned general formula (I) and having at least two phenolic hydroxyl groups in its molecule is obtained by the condensation reaction of a polyhydroxymethylated bisphenol compound with a phenolic compound, for example, in the presence of an acidic catalyst.

As the bisphenol compound, though not limited to the particular compounds, commercially available bisphenol compounds, such as bisphenol A, bisphenol F, bisphenol S, and bisphenol Z, may be used. Among other compounds, bisphenol A and bisphenol F are preferably used. As the phenolic compound, phenol, alkyl phenols, such as various cresols and various xylenols, and naphthols may be used. Among other compounds, o-cresol and 2,6-xylenol are preferably used. Further, these compounds may be used in the form of a mixture.

The ratio of addition of the cyclic ether group-containing compound (b), such as an alkylene oxide and a cyclic carbonate, to the phenolic compound (a) mentioned above is preferred to be 0.5 to 5.0 mols, preferably 0.8 to 3.0 mols, per one equivalent of a phenolic hydroxyl group of the phenolic compound (a). If this ratio is less than 0.5 mol, the resultant carboxyl group-containing photosensitive resin will suffer from an undesirable decline in photocuring properties. Conversely, if the ratio exceeds 5.0 mols, the resin will suffer from an undesirable decline in drying characteristics.

The addition reaction of the cyclic ether group-containing compound (b) to the phenolic compound (a) is carried out, for example, in the presence of an alkali metal compound such as sodium hydroxide, or a quaternary basic salt compound such as trimethylbenzyl ammonium hydroxide, tetramethylammonium hydroxide, and tetraethylammonium hydroxide, or a mixture of the alkali metal compound and the quaternary basic salt compound by using an organic solvent such as acetates like ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate, ketones like methyl ethyl ketone, cyclohexanone, and methylisobutyl ketone, and aromatic hydrocarbons like toluene, xylene, and tetramethyl benzene, or a mixed solvent of these compounds, at a temperature in the range of 80 to 180° C. under a pressure in the range of normal pressure to 10 kg/cm$^2$. Particularly, ketones and aromatic hydrocarbons are advantageously used either singly or as a mixed solvent of two or more members.

As the cyclic ether group-containing compound (b) mentioned above, an alkylene oxide and a cyclic carbonate may be preferably used.

As the alkylene oxides, ethylene oxide, propylene oxide, trimethylene oxide, tetrahydrofuran, tetrahydropyran, etc. may be cited.

As the cyclic carbonate, ethylene carbonate, propylene carbonate, etc. may be cited.

The reaction temperature of the esterification reaction of the reaction product of the novolak type phenolic resin (a) of the particular structure and the cyclic ether group-containing compound (b) with the α,β-ethylenically unsaturated group-containing monocarboxylic acid (c), such as acrylic acid and methacrylic acid, is preferred to be in the approximate range of 50 to 150° C. The reaction may proceed under reduced pressure, under normal pressure, and under pressure as well. As a reaction solvent, n-hexane, cyclohexane, methylcyclohexane, benzene, toluene, xylene, trichloroethane, tetrachloroethylene, methyl chloroform, diisopropyl ether, and acetates such as ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate may be advantageously used. These solvents may be used either singly or in the form of a mixture of two or more members. As the esterification catalysts, sulfuric acid, hydrochloric acid, phosphoric acid, boron fluoride, methanesulfonic acid, benzenesulfonic acid, p-toluenesulfonic acid, cation exchange resins, etc. may be suitably used. The esterification reaction is preferred to be carried out in the presence of a polymerization inhibitor. As the polymerization inhibitors, hydroquinone, methylhydroquinone, hydroquinone monomethyl ether, catechol, pyrogallol, etc. may be advantageously used.

As the α,β-ethylenically unsaturated group-containing monocarboxylic acid (c) mentioned above, acrylic acid, dimer of acrylic acid, methacrylic acid, β-styrylacrylic acid, β-furfuryl acrylic acid, crotonic acid, α-cyanocinnamic acid, cinnamic acid, caprolactone adduct of (meth)acrylic acid, a half ester of a saturated or unsaturated dibasic acid anhydride with a (meth)acrylate having one hydroxyl group in its molecule, etc. may be cited. Among other α,β-ethylenically unsaturated group-containing monocarboxylic acids cited above, acrylic acid and/or methacrylic acid prove to be desirable from the viewpoint of the influence on the photochemical reactivity and the properties of the cured product, particularly heat resistance, resistance to moisture absorption, and electrical insulating properties. These α,β-ethylenically unsaturated group-containing monocarboxylic acids may be used either singly or in the form of a mixture of two or more members.

The carboxyl group-containing photosensitive resin (photosensitive prepolymer) of the present invention is obtained by reacting a polybasic acid anhydride (d) with the reaction product of the α,β-ethylenically unsaturated group-containing monocarboxylic acid (c) and the aforementioned reaction product of the novolak type phenolic resin (a) and the cyclic ether group-containing compound (b). In this reaction, the amount of use of the polybasic acid anhydride (d) is preferred to be in such an addition proportion that the acid value of the produced carboxyl group-containing photosensitive resin (A) falls in the range of 30 to 150 mg KOH/g, preferably 50 to 120 mg KOH/g. The reaction is performed in the presence or absence of an organic solvent to be described hereinafter and in the presence of a polymerization inhibitor such as hydroquinone and oxygen, usually at a temperature in the approximate range of 50 to 150° C. In this reaction, as occasion demands, a tertiary amine such as triethylamine, a quaternary ammonium salt such as triethylbenzyl ammonium chloride, an imidazole compound such as 2-ethyl-4-methylimidazole, and a phosphorus compounds such as triphenyl phosphine may be added to the reaction mixture as a catalyst.

As the polybasic acid anhydrides (d) mentioned above, alicyclic dibasic acid anhydrides such as methyltetrahydrophthalic anhydride, tetrahydrophthalic anhydride, hexahydrophthalic anhydride, methylhexahydrophthalic anhydride, nadic anhydride, 3,6-endomethylenetetrahydrophthalic anhydride, methylendomethylenetetrahydrophthalic anhydride, and tetrabromophthalic anhydride; aliphatic or aromatic dibasic acid anhydrides such as succinic anhydride, maleic anhydride, itaconic anhydride, octenylsuccinic anhydride, pentadodecenylsuccinic anhydride, phthalic anhydride, and trimellitic anhydride; and aliphatic or aromatic tetrabasic acid dianhydrides such as biphenyl-tetracarboxylic dianhydride, diphenyl ether-tetracarboxylic dianhydride, butane-tetracarboxylic dianhydride, cyclopentane-tetracarboxylic dianhydride, pyromellitic anhydride, and benzophenone-tetracarboxylic dianhydride may be cited. These polybasic acid anhydrides may be used either singly or in the form of a combination of two or more members. Among other polybasic acid anhydrides cited above, alicyclic dibasic acid anhydrides prove to be particularly desirable.

Further, another carboxyl group-containing photosensitive resin, for example a photosensitive resin obtained by addition of an acid anhydride to a reaction product of a novolak type and/or bisphenol type epoxy compound with an unsaturated monobasic acid and the like may be mixed into the curable resin composition of the present invention for the purpose of improving the properties thereof.

As the photopolymerization initiator (B) to be used in the curable resin composition of the present invention, one or more of photopolymerization initiators selected from the group consisting of oxime ester type photopolymerization initiators having an oxime ester group, α-aminoacetophenone type photopolymerization initiators, and acylphosphine oxide type photopolymerization initiators may be used.

As the commercially available oxime ester type photopolymerization initiators, CGI-325, IRGACURE (registered trademark) OXE01, and IRGACURE OXE02 manufactured by BASF Japan Ltd., N-1919 and ADEKA ARKLS NCI-831 manufactured by ADEKA CORPORATION, etc. may be cited. Further, a photopolymerization initiator having two oxime ester groups in its molecule may also be preferably used. As a concrete examples thereof, oxime ester compounds having the carbazole structure represented by the following general formula (II) may be cited.

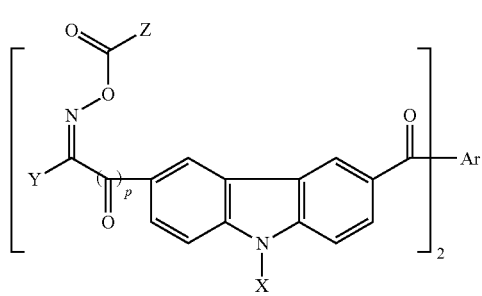

In the formula, X represents a hydrogen atom, an alkyl group of 1-17 carbon atoms, an alkoxy group of 1-8 carbon atoms, a phenyl group, a phenyl group substituted by an alkyl group of 1-17 carbon atoms, an alkoxy group of 1-8 carbon atoms, an amino group, or an alkylamino group or dialkylamino group having an alkyl group of 1-8 carbon atoms, or a naphthyl group substituted by an alkyl group of 1-17 carbon atoms, an alkoxy group of 1-8 carbon atoms, an amino group, or an alkylamino group or dialkylamino group having an alkyl group of 1-8 carbon atoms, Y and Z independently represent a hydrogen atom, an alkyl group of 1-17 carbon atoms, an alkoxy group of 1-8 carbon atoms, a halogen group, a phenyl group, a phenyl group substituted by an alkyl group of 1-17 carbon atoms, an alkoxy group of 1-8 carbon atoms, an amino group, or an alkylamino group or dialkylamino group having an alkyl group of 1-8 carbon atoms, or a naphthyl group substituted by an alkyl group of 1-17 carbon atoms, an alkoxy group of 1-8 carbon atoms, an amino group, or an alkylamino group or dialkylamino group having an alkyl group of 1-8 carbon atoms, an anthryl group, a pyridyl group, a benzofuryl group, or a benzothienyl group, Ar represents an alkylene of 1-10 carbon atoms, a vinylene, a phenylene, a biphenylene, a pyridylene, a naphthylene, an anthrylene, a thienylene, a furylene, 2,5-pyrrole-diyl, 4,4'-stilbene-diyl, or 4,2'-styrene-diyl, and "p" is an integer of 0 or 1.

Particularly, it is preferred that in the above-mentioned formula X and Y be a methyl group or an ethyl group, respectively, Z be a methyl or a phenyl, p is 0, and Ar is a phenylene, a naphthylene, or a thienylene.

The amount of the above-mentioned oxime ester type photopolymerization initiator to be incorporated in the composition is preferred to be in the range of 0.01 to 5 parts by weight, based on 100 parts by weight of the aforementioned carboxyl group-containing photosensitive resin. If the amount is less than 0.01 part by weight based on 100 parts by weight of the above-mentioned carboxyl-group containing photosensitive resin, the photocuring properties of the resultant curable resin composition on copper becomes insufficient, thereby undesirably causing the peeling of a coating film and deterioration of the properties of the coating film, such as resistance to chemicals. Conversely, if the amount of the oxime ester type photopolymerization initiator exceeds 5 parts by weight based on 100 parts by weight of the above-mentioned carboxyl-group containing photosensitive resin, undesirably the photocuring properties in a deep portion of the coating film will tend to become inferior due to the increasing light absorption by the photopolymerization initiator in the surface of the coating film of solder resist. The more preferred amount is 0.5 to 3 parts by weight, based on 100 parts by weight of the aforementioned carboxyl group-containing photosensitive resin.

As concrete examples of the α-aminoacetophenone type photopolymerization initiator, 2-methyl-1-[4-(methylthio)phenyl]-2-morpholinopropan-1-one, 2-benzyl-2-dimethylamino-1-(4-morpholinophenyl)-butan-1-one, 2-(dimethylamino)-2-[(4-methylphenyl)methyl]-1-[4-(4-morpholinyl)phenyl]-butan-1-one, N,N-dimethylaminoacetophenone, etc. may be cited. As the commercially available products, IRGACURE 907, IRGACURE 369, and IRGACURE 379 manufactured by BASF Japan Ltd., etc. may be cited.

As concrete examples of the acylphosphine oxide type photopolymerization initiator, 2,4,6-trimethylbenzoyl-diphenyl phosphine oxide, bis(2,4,6-trimethyl benzoyl)-phenyl phosphine oxide, bis(2,6-dimethoxybenzoyl)-2,4,4-trimethyl-pentyl phosphine oxide, etc. may be cited. As the commercially available products, LUCIRIN TPO manufactured by BASF Japan Ltd., IRGACURE 819 manufactured by BASF Japan Ltd., etc. may be cited.

The amount of these α-aminoacetophenone type photopolymerization initiator and acylphosphine oxide type photopolymerization initiator to be incorporated in the composition is preferred to be in the range of 0.01 to 15 parts by weight, based on 100 parts by weight of the aforementioned carboxyl group-containing photosensitive resin. If the amount is less than 0.01 part by weight based on 100 parts by weight of the above-mentioned carboxyl-group containing photosensitive resin, the photocuring properties of the resultant curable resin composition on copper becomes insufficient, thereby undesirably causing the peeling of a coating film and deterioration of the properties of the coating film, such as resistance to chemicals. Conversely, if the amount exceeds 15 parts by weight based on 100 parts by weight of the above-mentioned carboxyl-group containing photosensitive resin, undesirably the effect of reducing outgassing will not be attained and the photocuring properties in a deep portion of the coating film will tend to become inferior due to the increasing light absorption by the photopolymerization initiator in the surface of the coating film of solder resist. The more preferred amount is 0.5 to 10 parts by weight, based on 100 parts by weight of the aforementioned carboxyl group-containing photosensitive resin.

As the other photopolymerization initiators, photo-initiator aids and sensitizers which may be preferably used in the curable resin composition of the present invention, a benzoin compound, an acetophenone compound, an anthraquinone compound, a thioxanthone compound, a ketal compound, a benzophenone compound, a tertiary amine compound, a xanthone compound, etc. may be cited.

As concrete examples of the benzoin compound, for example, benzoin, benzoin methyl ether, benzoin ethyl ether, benzoin isopropyl ether, etc. may be cited.

As concrete examples of the acetophenone compound, for example, acetophenone, 2,2-dimethoxy-2-phenyl acetophenone, 2,2-diethoxy-2-phenyl acetophenone, 1,1-dichloroacetophenone, etc. may be cited.

As concrete examples of the anthraquinone compound, for example, 2-methylanthraquinone, 2-ethylanthraquinone, 2-t-butylanthraquinone, 1-chloroanthraquinone, etc. may be cited.

As concrete examples of the thioxanthone compound, for example, 2,4-dimethylthioxanthone, 2,4-diethylthioxanthone, 2-chlorothioxanthone, 2,4-diisopropylthioxanthone, etc. may be cited.

As concrete examples of the ketal compound, for example, acetophenone dimethyl ketal, benzyl dimethyl ketal, etc. may be cited.

As concrete examples of the benzophenone compound, for example, benzophenone, 4-benzoyldiphenylsulfide, 4-benzoyl-4'-methyldiphenylsulfide, 4-benzoyl-4'-ethyldiphenylsulfide, 4-benzoyl-4'-propyldiphenylsulfide, etc. may be cited.

As concrete examples of the tertiary amine compound, for example, an ethanolamine compound and a compound having dialkyl aminobenzene structure may be cited. As the commercially available products, for example, dialkylaminobenzophenones such as 4,4'-dimethylaminobenzophenone (NISSO Cure MABP manufactured by Nippon Soda Co., Ltd.) and 4,4'-diethylaminobenzophenone (EAB manufactured by Hodogaya Chemical Co., Ltd.), dialkylamino group-containing coumarin compounds such as 7-(diethylamino)-4-methyl-2H-1-benzopyran-2-one (7-(diethylamino)-4-methylcoumarin), ethyl 4-dimethylaminobenzoate (Kaya Cure (registered trademark) EPA manufactured by Nippon Kayaku Co., Ltd.), ethyl 2-dimethylaminobenzoate (Quantacure DMB manufactured by International Biosynthetic Inc.), (n-butoxy)ethyl 4-dimethylaminobenzoate (Quantacure BEA manufactured by the international Biosynthetic Inc.), isoamylethyl p-dimethylaminobenzoate (Kaya Cure DMBI manufactured by Nippon Kayaku Co., Ltd.), 2-ethylhexyl 4-dimethylaminobenzoate (Esolol 507 manufactured by Van Dyk GmbH), 4,4'-diethylaminobenzophenone (EAB manufactured by Hodogaya Chemical Co., Ltd.), etc. may be cited.

Among other compounds, a thioxanthone compound and a tertiary amine compound are preferred. Particularly, the incorporation of the thioxanthone compound is preferred from the viewpoint of the photocuring properties in a deep portion of a coating film. In particular, the incorporation of the thioxanthone compound such as 2,4-dimethylthioxanthone, 2,4-diethylthioxanthone, 2-chlorothioxanthone, and 2,4-diisopropylthioxanthone proves to be preferable.

The amount of such a thioxanthone compound to be incorporated in the composition is preferred to be not more than 20 parts by weight, based on 100 parts by weight of the aforementioned carboxyl group-containing photosensitive resin. If the amount of the thioxanthone compound exceeds 20 parts by weight based on 100 parts by weight of the above-mentioned carboxyl-group containing photosensitive resin, undesirably the photocuring properties of the resultant curable resin composition will be deteriorated when its film thickness is large, thereby leading to the increase in cost of a product. The more preferred amount is not more than 10 parts by weight, based on 100 parts by weight of the aforementioned carboxyl group-containing photosensitive resin.

As the tertiary amine compound, a compound having dialkyl aminobenzene structure is preferred, in particular a dialkylaminobenzophenone compound, a dialkylamino group-containing coumarin compound exhibiting the maximal absorption wavelength in 350-450 nm, and ketocoumarins are preferred.

As the dialkylaminobenzophenone compound, 4,4'-diethylaminobenzophenone is preferred because its toxicity is low. Since the dialkylamino group-containing coumarin compound exhibits the maximal absorption wavelength in 350-410 nm of the ultraviolet region, it has weak tinting power and thus makes possible to provide a colorless, transparent photosensitive composition as well as, by the use of a coloring pigment, a colored solder resist film reflecting the color of the coloring pigment itself. Particularly, 7-(diethylamino)-4-methyl-2H-1-benzopyran-2-one is preferred because it exhibits excellent sensitizing effect to the laser beam of a wavelength of 400-410 nm.

The amount of the tertiary amine compound mentioned above to be incorporated in the composition is preferred to be in the range of 0.1 to 20 parts by weight, based on 100 parts by weight of the aforementioned carboxyl group-containing photosensitive resin. If the amount is less than 0.1 part by weight based on 100 parts by weight of the above-mentioned carboxyl-group containing photosensitive resin, the sufficient sensitizing effect will not be attained. Conversely, if the amount exceeds 20 parts by weight based on 100 parts by weight of the above-mentioned carboxyl-group containing photosensitive resin, undesirably the photocuring properties in a deep portion of a coating film will tend to become inferior due to the increasing light absorption by the tertiary amine compound in the surface of a dried coating film of solder resist. The more preferred amount is 0.1 to 10 parts by weight, based on 100 parts by weight of the aforementioned carboxyl group-containing photosensitive resin. These photopolymerization initiators, photo-initiator aids and sensitizers may be used either singly or in the form of a mixture of two or more members.

The total amount of the photopolymerization initiator, the photo-initiator aid and the sensitizer mentioned above is preferred to be not more than 35 parts by weight, based on 100 parts by weight of the aforementioned carboxyl group-containing photosensitive resin. If the amount exceeds 35 parts by weight based on 100 parts by weight of the above-mentioned carboxyl-group containing photosensitive resin, the photocuring properties in a deep portion of a coating film will tend to become inferior due to the light absorption by these compounds.

Incidentally, since these photopolymerization initiators, photo-initiator aids and sensitizers absorb the light of specific wavelength, under certain circumstances they may act as an ultraviolet light absorber and the sensitivity may become low. However, these are not used for the purpose of only increasing the sensitivity of a composition. By formulating the composition so as to absorb the light of specific wavelength, as occasion demands, thereby increasing the photo-reactivity in the surface, it is possible to change the line shape and the opening of a resist to a perpendicular shape, a tapered shape, or a reverse tapered shape, and to increase the processing accuracy of a line width or an opening diameter.

Further, the curable resin composition of the present invention may contain a well-known and widely used carboxyl group-containing resin besides the carboxyl group-containing photosensitive resin to be used in the present invention for the purpose of adjusting the balance of various properties, such as developability and tackiness. Among other carboxyl group-containing resins, it is preferred that the carboxyl group-containing resin which is free of chlorine ion or containing chlorine ions in a very small amount be used because the carboxyl group-containing photosensitive resin of the present invention contains no chlorine ion impurity.

Furthermore, a thermosetting component (C) may be added to the curable resin composition of the present invention in order to impart heat resistance thereto. As concrete examples of the thermosetting component, any known thermosetting resins, such as a blocked isocyanate compound, an amino resin, a maleimide compound, a benzoxazine resin, a carbodiimide resin, a cyclocarbonate compound, a polyfunctional epoxy compound, a polyfunctional oxetane compound, an episulfide resin, may be used. Among other thermosetting components, the thermosetting components having a plurality of cyclic ether groups and/or cyclic thioether groups (hereinafter briefly referred to as cyclic (thio)ether groups) in its molecule prove to be desirable. Many kinds of the thermosetting components having these cyclic (thio)ether groups are commercially available and can give various properties by their structures.

The thermosetting component having a plurality of cyclic (thio)ether groups in its molecule as mentioned above is a compound having a plurality of either one or two kinds of 3-, 4- or 5-membered cyclic ether groups or cyclic thioether groups in its molecule. For example, a compound having a plurality of epoxy groups in its molecule, i.e. a polyfunctional epoxy compound, a compound having a plurality of oxetanyl groups in its molecule, i.e. a polyfunctional oxetane compound, a compound having a plurality of thioether groups in its molecule, i.e. an episulfide resin may be cited.

As the polyfunctional epoxy compounds, for example, bisphenol A type epoxy resins represented by jER 828, jER 834, jER 1001, and jER 1004 produced by Mitsubishi Chemical Corporation, EPICLON (registered trademark) 840, EPICLON 850, EPICLON 1050, and EPICLON 2055 produced by DIC Corporation, Epo Tohto (registered trademark) YD-011, YD-013, YD-127, and YD-128 produced by Shinnittetsu Chemical Co., Ltd., D.E.R. 317, D.E.R. 331, D.E.R. 661, and D.E.R. 664 produced by The Dow Chemical Company, ARALDITE 6071, ARALDITE 6084, ARALDITE GY250, and ARALDITE GY260 produced by BASF Japan Ltd., Sumi-epoxy ESA-011, ESA-014, ELA-115, and ELA-128 produced by Sumitomo Chemical Co., Ltd., and A.E.R. 330, A.E.R. 331, A.E.R. 661, and A.E.R. 664 produced by Asahi Chemical Industry Co., Ltd. (all trade names); brominated epoxy resins represented by jER YL903 produced by Mitsubishi Chemical Corporation, EPICLON 152 and EPICLON 165 produced by DIC Corporation, Epo Tohto YDB-400 and YDB-500 produced by Shinnittetsu Chemical Co., Ltd., D.E.R. 542 produced by The Dow Chemical Company, ARALDITE 8011 produced by BASF Japan Ltd., Sumi-epoxy ESB-400 and ESB-700 produced by Sumitomo Chemical Co., Ltd., and A.E.R. 711 and A.E.R. 714 produced by Asahi Chemical Industry Co., Ltd. (all trade names); novolak type epoxy resins represented by jER 152 and jER 154 produced by Mitsubishi Chemical Corporation, D.E.N. 431 and D.E.N. 438 produced by The Dow Chemical Company, EPICLON N-730, EPICLON N-770, and EPICLON N-865 produced by DIC Corporation, Epo Tohto YDCN-701 and YDCN-704 produced by Shinnittetsu Chemical Co., Ltd., ARALDITE ECN1235, ARALDITE ECN1273, ARALDITE ECN1299, and ARALDITE XPY307 produced by BASF Japan Ltd., EPPN (registered trademark)-201, EOCN (registered trademark)-1025, EOCN-1020, EOCN-104S, and RE-306 produced by Nippon Kayaku Co., Ltd., Sumi-epoxy ESCN-195x and ESCN-220 produced by Sumitomo Chemical Co., Ltd., and A.E.R. ECN-235 and ECN-299 produced by Asahi Chemical Industry Co., Ltd. (all trade names); bisphenol F type epoxy resins represented by EPICLON 830 produced by DIC Corporation, jER 807 produced by Mitsubishi Chemical Corporation, Epo Tohto YDF-170, YDF-175, and YDF-2004 produced by Shinnittetsu Chemical Co., Ltd., and ARALDITE XPY306 produced by BASF Japan Ltd. (all trade names); hydrogenated bisphenol A type epoxy resins represented by Epo Tohto ST-2004, ST-2007, and ST-3000 produced by Shinnittetsu Chemical Co., Ltd. (all trade names); glycidylamine type epoxy resins represented by jER 604 produced by Mitsubishi Chemical Corporation, Epo Tohto YH-434 produced by Shinnittetsu Chemical Co., Ltd., ARALDITE MY720 produced by BASF Japan Ltd., and Sumi-epoxy ELM-120 produced by Sumitomo Chemical Co., Ltd. (all trade names); hydantoin type epoxy resins represented by ARALDITE CY-350 produced by BASF Japan Ltd. (trade name); alicyclic epoxy resins represented by Celloxide (registered trademark) 2021 produced by Daicel Chemical Industries, Ltd., and ARALDITE CY175 and CY179 produced by BASF Japan Ltd. (all trade names); trihydroxyphenyl methane type epoxy resins represented by YL-933 produced by Mitsubishi Chemical Corporation, T.E.N. produced by The Dow Chemical Company, and EPPN-501 and EPPN-502 produced by Nippon Kayaku Co., Ltd. (all trade names); bixylenol type or biphenol type epoxy resins or mixtures thereof represented by YL-6056, YX-4000, and YL-6121 produced by Mitsubishi Chemical Corporation. (all trade names); bisphenol S type epoxy resins represented by EBPS-200 produced by Nippon Kayaku Co., Ltd., EPX-30 produced by ADEKA CORPORATION, and EXA-1514 produced by DIC Corporation. (all trade names); bisphenol A novolak type epoxy resins represented by jER 157S (trade name) produced by Mitsubishi Chemical Corporation; tetraphenylol ethane type epoxy resins represented by jER YL-931 produced by Mitsubishi Chemical Corporation, and ARALDITE 163 produced by BASF Japan Ltd. (all trade names); heterocyclic epoxy resins represented by ARALDITE PT810 (trade name) produced by BASF Japan Ltd. and TEPIC (registered trademark) produced by Nissan Chemical Industries Ltd.; diglycidyl phthalate resin represented by BLEMMER (registered trademark) DGT produced by Nippon Oil and Fats Co., Ltd.; tetraglycidyl xylenoyl ethane resins represented by ZX-1063 (trade name) produced by Shinnittetsu Chemical Co., Ltd.; naphthalene group-containing epoxy resins represented by ESN-190 and ESN-360 produced by Shinnittetsu Chemical Co., Ltd. and HP-4032, EXA-4750, and EXA-4700 produced by DIC Corporation. (all trade names); dicyclopentadiene skeleton-containing epoxy resins represented by HP-7200 and HP-7200H produced by DIC Corporation. (all trade names); glycidylmethacrylate copolymer type epoxy resins represented by CP-50S and CP-50M produced by Nippon Oil and Fats Co., Ltd. (all trade names); copolymeric epoxy resin of cyclohexylmaleimide and glycidyl methacrylate; epoxy-modified polybutadiene rubber derivatives (for example, PB-3600 produced by Daicel Chemical Industries, Ltd.), CTBN-modified epoxy resins (for example, YR-102 and YR-450 produced by Shinnittetsu Chemical Co., Ltd.) may be cited, but are not limited to these epoxy resins. These epoxy resins may be used either singly or in the form of a combination of two or more members.

As the polyfunctional oxetane compounds, bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, their oligomers or polymers, and etherified products of an oxetane alcohol with a hydroxyl group-containing resin, such as a novolak resin, poly(p-hydroxy styrene), cargo type bisphenols, calixarenes, calixresorcinarenes, or silsesquioxane, may be cited. Besides, copolymers of an unsaturated monomer having an oxetane ring with an alkyl(meth)acrylate may be cited.

As the episulfide resin, for example, YL7000 (a bisphenol A type episulfide resin) manufactured by Mitsubishi Chemical Corporation. may be cited. Further, an episulfide resin containing a sulfur atom in place of an oxygen atom of an epoxy group of a novolak type epoxy resin obtained by the similar synthetic method may be used.

The amount of such a thermosetting component having a plurality of cyclic (thio)ether groups in its molecule to be incorporated in the composition is preferred to be in the range of 0.6 to 2.5 equivalent weights per one equivalent weight of the carboxyl group of the carboxyl group-containing photosensitive resin mentioned above. If the amount of the thermosetting component is less than 0.6 equivalent weight per one equivalent weight of the carboxyl group of the carboxyl group-containing photosensitive resin, undesirably the carboxyl group will remain in a solder resist film so that the resistance to heat, the resistance to alkalis, the electrical insulating properties, etc. of the film will be deteriorated. Conversely, if the amount of the thermosetting component exceeds 2.5 equivalent weights per one equivalent weight of the carboxyl group of the carboxyl group-containing photosensitive resin, undesirably the cyclic (thio)ether compound of a low molecular weight will remain in a dried coating film so that the strength of the coating film will be deteriorated. More preferred amount is 0.8 to 2.0 equivalent weights per one equivalent weight of the carboxyl group of the carboxyl group-containing resin.

When the thermosetting component having a plurality of cyclic (thio)ether groups in its molecule is used, it is preferable that the composition should contain a thermosetting catalyst. As such a thermosetting catalyst, for example, imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine; hydrazine compounds such as dihydrazide adipate and dihydrazide sebacate; and phosphorus compounds such as triphenylphosphine may be cited.

As the commercially available thermosetting catalysts, for example, products of Shikoku Chemicals Co., Ltd.; 2MZ-A, 2MZ-OK, 2PHZ, 2P4BHZ, and 2P4 MHZ (invariably trade names for imidazole type compounds), and products of Sun-Apro K.K.; U-CAT (registered trademark) 3503N and U-CAT3502T (invariably trade names for isocyanate compounds blocked with dimethyl amine) and DBU, DBN, U-CATSA102, and U-CAT5002 (invariably trade names for dicyclic amizine compounds and salts thereof) may be cited. The thermosetting catalyst is not limited to the compounds cited above. Any thermosetting catalysts for an epoxy resin and an oxetane compound and any compounds which can promote the reaction of an epoxy group and/or an oxetanyl group with a carboxyl group may be used either singly or in the form of a mixture of two or more members. Furthermore, S-triazine derivatives such as guanamine, acetoguanamine, benzoguanamine, melamine, 2,4-diamino-6-methacryloyloxyethyl-S-triazine, 2-vinyl-4,6-diamino-S-triazine, isocyanuric acid adduct of 2-vinyl-4,6-diamino-S-triazine, isocyanuric acid adduct of 2,4-diamino-6-methacryloyloxyethyl-S-triazine may also be used. Preferably, these compounds which also function as an adhesiveness-imparting agent are used in combination with the thermosetting catalyst mentioned above.

The amount of the thermosetting catalyst to be incorporated in the composition may be sufficient in the conventionally used range, for example, preferably in the range of 0.1 to 20 parts by weight, more preferably 0.5 to 15.0 parts by weight, based on 100 parts by weight of the carboxyl group-containing photosensitive resin or the thermosetting component having a plurality of cyclic (thio)ether groups in its molecule.

The curable resin composition of the present invention may incorporate a colorant therein. As the colorant, a known coloring agent of red, blue, green, yellow, etc. may be used and any of pigments, dyes and dyestuff may be sufficient. However, it is preferred that they do not contain halogen from the viewpoint of reducing impact on the environment and influence on a human body.

Red Colorant:

As a red colorant, there are a monoazo type, a disazo type, an azo rake type, a benzimidazolone type, a perylene type, a diketo-pyrrolo-pyrrole type, a condensation azo type, an anthraquinone type, a quinacridone type, etc. As concrete examples, those having the following Color Index (C.I.; issued by The Society of Dyers and Colourists) numbers may be cited.

Monoazo type: Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, and 269.

Disazo type: Pigment Red 37, 38, and 41.

Monoazo rake type: Pigment Red 48:1, 48:2, 48:3, 48:4, 49:1, 49:2, 50:1, 52:1, 52:2, 53:1, 53:2, 57:1, 58:4, 63:1, 63:2, 64:1, and 68.

Benzimidazolone type: Pigment Red 171, 175, 176, 185, and 208.

Perylene type: Solvent Red 135 and 179, Pigment Red 123, 149, 166, 178, 179, 190, 194, and 224.

Diketo-pyrrolo-pyrrole type: Pigment Red 254, 255, 264, 270, and 272.

Condensation azo type: Pigment Red 220, 144, 166, 214, 220, 221, and 242.

Anthraquinone type: Pigment Red 168, 177, and 216, Solvent Red 149, 150, 52, and 207.

Quinacridone type: Pigment Red 122, 202, 206, 207, and 209.

Blue Colorant:

As a blue colorant, there are a phthalocyanine type and an anthraquinone type. As a pigment type, a compound which is classified into a pigment, concretely the following pigments may be cited; Pigment Blue 15, 15:1, 15:2, 15:3, 15:4, 15:6, 16, and 60. As a dye type, Solvent Blue 35, 63, 68, 70, 83, 87, 94, 97, 122, 136, 67, 70, etc. may be used. Besides the compounds mentioned above, a phthalocyanine compound which is substituted or not substituted by metal may also be used.

Green Colorant:

As a green colorant, similarly there are a phthalocyanine type, an anthraquinone type, and a perylene type. Specifically, Pigment Green 7 and 36, Solvent Green 3, 5, 20, and 28 may be used. Besides the compounds mentioned above, a phthalocyanine compound which is substituted or not substituted by metal may also be used.

Yellow Colorant:

As a yellow colorant, there are a monoazo type, a disazo type, a condensation azo type, a benzimidazolone type, an isoindolinone type, an anthraquinone type, etc., and the following are specifically cited.

Anthraquinone type: Solvent Yellow. 163, Pigment Yellow 24, 108, 193, 147, 199, and 202.

Isoindolinone type: Pigment Yellow 110, 109, 139, 179, and 185.

Condensation azo type: Pigment Yellow 93, 94, 95, 128, 155, 166, and 180.

Benzimidazolone type: Pigment Yellow 120, 151, 154, 156, 175, and 181.

Monoazo type: Pigment Yellow 1, 2, 3, 4, 5, 6, 9, 10, 12, 61, 62, 62:1, 65, 73, 74, 75, 97, 100, 104, 105, 111, 116, 167, 168, 169, 182, and 183.

Disazo type: Pigment Yellow 12, 13, 14, 16, 17, 55, 63, 81, 83, 87, 126, 127, 152, 170, 172, 174, 176, 188, and 198.

In addition, any coloring agents of purple, orange, brown, black, etc. may be added to the composition for the purpose of adjusting a color tone.

As concrete examples thereof, Pigment Violet 19, 23, 29, 32, 36, 38, and 42, Solvent Violet 13 and 36, C.I. Pigment Orange 1, 5, 13, 14, 16, 17, 24, 34, 36, 38, 40, 43, 46, 49, 51, 61, 63, 64, 71, and 73, Pigment Brown 23 and 25, Pigment Black 1 and 7, etc. may be cited.

The amount of the above-mentioned colorant to be incorporated in the composition is not limited to a particular range, but it is preferred to be not more than 10 parts by weight, more preferably 0.1 to 5 parts by weight, based on 100 parts by weight of the aforementioned carboxyl group-containing photosensitive resin.

The curable resin composition of the present invention may contain a compound which has a plurality of ethylenically unsaturated groups in its molecule and is capable of curing by irradiation with an active energy ray in order to improve the photocuring properties of the resultant curable resin composition.

As such a compound, known polyester (meth)acrylates, polyether (meth)acrylates, urethane (meth)acrylates, carbonate (meth)acrylates, epoxy(meth)acrylates, etc., may be used. As concrete examples thereof, hydroxyalkyl acrylates such as 2-hydroxyethyl acrylate and 2-hydroxypropyl acrylate; diacrylates of glycols such as ethylene glycol, methoxytetraethylene glycol, polyethylene glycol, and propylene glycol; acrylamides such as N,N-dimethyl acrylamide, N-methylol acrylamide, and N,N-dimethylaminopropyl acrylamide; aminoalkyl acrylates such as N,N-dimethylaminoethyl acrylate and N,N-dimethylaminopropyl acrylate; polyfunctional acrylates of polyhydric alcohols, such as hexane diol, trimethylol propane, pentaerythritol, dipentaerythritol, and tris-hydroxyethyl isocyanurate, and ethylene oxide adducts, propylene oxide adducts or ε-caprolactone adduct of these polyhydric alcohols; polyfunctional acrylates of phenols and ethylene oxide adducts or propylene oxide adducts of phenols such as phenoxy acrylate and bisphenol A diacrylate; polyfunctional acrylates of glycidyl ethers such as glycerin diglycidyl ether, glycerin triglycidyl ether, trimethylol propane triglycidyl ether, and triglycidyl isocyanurate; acrylates obtained by directly acrylating or urethane-acrylating via a diisocyanate a polyol such as polyether polyol, polycarbonatediol, hydroxyl group-terminated polybutadiene, and polyester polyol; melamine acrylate, and/or methacrylates corresponding to the acrylates enumerated above may be cited.

Further, an epoxy acrylate resin obtained by the reaction of a polyfunctional epoxy resin such as a cresol novolak type epoxy resin with acrylic acid, an epoxy urethane acrylate compound obtained by causing a half urethane compound of a hydroxyl acrylate such as pentaerythritol triacrylate and a diisocyanate such as isophorone diisocyanate to react with the hydroxyl group of the epoxy acrylate resin mentioned above, or the like may be cited. Such an epoxy acrylate type resin is capable of improving the photocuring properties, without deteriorating the tack-free touch of finger of a dried coating film.

The amount of such a compound having a plurality of ethylenically unsaturated groups in its molecule to be incorporated in the composition is desired to be in the range of 5 to 100 parts by weight, based on 100 parts by weight of the carboxyl group-containing photosensitive resin mentioned above. If the amount of the compound is less than 5 parts by weight based on 100 parts by weight of the above-mentioned carboxyl group-containing photosensitive resin, undesirably the photocuring properties of the resultant curable resin composition will become inferior, and after irradiation with an active energy ray, it will be difficult to complete the pattern formation with an alkali development. Conversely, if the amount exceeds 100 parts by weight, undesirably the solubility of the composition in an aqueous alkaline solution will become inferior and a coating film will become brittle. A more preferred amount is 5 to 70 parts by weight, based on 100 parts by weight of the carboxyl group-containing photosensitive resin mentioned above.

The curable resin composition of the present invention may further incorporate a filler therein, as occasion demands, in order to increase the physical strength of a coating film. As such a filler, any known inorganic or organic fillers may be used. Particularly, barium sulfate, spherical silica, talc, and Neuburg siliceous earth prove to be desirable. Further, a metallic oxide, such as titanium oxide, and a metal hydroxide, such as aluminum hydroxide, may be used also as an filler in order to impart white appearance and flame retardancy to a coating film.

Further, a binder polymer may be used for the curable resin composition of the present invention for the purpose of improving the tack-free touch of finger of a dried coating film, handling characteristics thereof, etc. For example, a polyester type polymer, a polyurethane type polymer, a polyester urethane type polymer, a polyamide type polymer, a polyester amide type polymer, an acrylic polymer, a cellulose type polymer, a polylactic acid type polymer, a phenoxy type polymer, etc. may be used. These binder polymers may be used either singly or in the form of a mixture of two or more members.

Furthermore, other elastomers may be used for the curable resin composition of the present invention for the purpose of imparting flexibility to and improving brittleness of a cured product. For example, a polyester type elastomer, a polyurethane type elastomer, a polyester urethane type elastomer, a polyamide type elastomer, a polyester amide type elastomer, an acrylic elastomer, an olefin type elastomer, etc. may be used. Any resins obtained by modifying part or the whole of the epoxy groups of the epoxy resins having various skeletons with a butadiene-acrylonitrile rubber of which both ends are modified to carboxyl groups may also be used. Moreover, an epoxy group-containing polybutadiene type elastomer, an acryloyl group-containing polybutadiene type elastomer, a hydroxyl group-containing polybutadiene type elastomer, etc. may be used. These elastomers may be used either singly or in the form of a mixture of two or more members.

The curable resin composition of the present invention may further use any compounds which are capable of improving various properties required for improvement in various characteristics, such as an antioxidant, a chain transfer agent, an adhesiveness-imparting agent, an adhesiveness promoter, a copper deactivator, a polymerization inhibitor, and an anticorrosive agent, may be used.

The curable resin composition of the present invention may use an organic solvent for the synthesis of the carboxyl group-containing photosensitive resin or preparation of the composition or for the purpose of adjusting the viscosity of the composition to a level suitable for application to a substrate or a carrier film.

As such an organic solvent, for example, ketones, aromatic hydrocarbons, glycol ethers, glycol ether acetates, esters, alcohols, aliphatic hydrocarbons, and petroleum solvents may be cited. As concrete examples, ketones such as methylethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, dipropylene glycol methyl ether acetate, propylene glycol methyl ether acetate, propylene glycol ethyl ether acetate, and propylene glycol butyl ether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha may be cited. These organic solvents may be used either singly or in the form of a mixture of two or more members.

The curable resin composition of the present invention having such a composition as described above is adjusted to a level of viscosity suitable for a particular coating method by dilution when necessary, then applied by the technique of screen printing, curtain coating, spray coating, roll coating, or the like to a printed circuit board having a circuit preparatory formed thereon, and then dried at a temperature in the approximate range of 60 to 100° C., for example, to expel by evaporation the organic solvent contained in the composition to produce a tuck-free coating film. The coating film is then exposed to active energy rays, such as a laser beam, by projecting the beam directly on the coating film according to a prescribed pattern or selectively exposed to active energy rays through a photomask having a prescribed exposure pattern and the unexposed area of the coating film is developed with an aqueous alkali solution to form a resist pattern. The resist film formed in the prescribed pattern as described above is finally cured by heating, or by irradiation with active energy rays and subsequent heating, or by heating and subsequent irradiation with active energy rays to give birth to a cured film (cured product) which excels in adhesiveness, resistance to soldering heat, resistance to moisture absorption, PCT resistance, resistance to electroless gold plating, flexing resistance, folding endurance, flexibility, warpage, and electrical insulating properties.

As an aqueous alkali solution mentioned above, aqueous alkali solutions of potassium hydroxide, sodium hydroxide, sodium carbonate, potassium carbonate, sodium phosphate, sodium silicate, ammonia, amines, etc. can be used.

Suitable light sources which are used for the purpose of photocuring the composition are a low-pressure mercury vapor lamp, a medium-pressure mercury vapor lamp, a high-pressure mercury vapor lamp, an ultra-high-pressure mercury vapor lamp, a xenon lamp, and a metal halide lamp, for example. Also, a laser beam may be used as the active energy rays.

Now, the present invention will be more specifically described below with reference to working examples. However, the present invention is not limited to the following examples. Wherever "parts" is mentioned hereinbelow, it invariably refers to that based on weight unless otherwise specified.

Preparation of Carboxyl Group-Containing Photosensitive Resins

SYNTHETIC EXAMPLE 1

Into a flask equipped with a cooling tube and a stirrer, 456 parts of bisphenol A, 228 parts of water, and 649 parts of 37% formalin were charged and 228 parts of an aqueous 25% sodium hydroxide solution was added thereto while keeping the temperature at 40° C. or less. After completion of the addition, they were left reacting for 10 hours at 50° C. After completion of the reaction, the solution was cooled to 40° C. and neutralized with an aqueous 37.5% phosphoric acid solution till pH 4 while keeping the temperature at 40° C. or less. Then, the solution was left at rest and a water phase was separated therefrom. After separation of the water phase, 300 parts of methyl isobutyl ketone was added to the reaction product to dissolve it uniformly. Thereafter, the resultant solution was washed with 500 parts of distilled water three times, and water, the solvent, etc. were removed therefrom under reduced pressure at a temperature of 50° C. or less. The resultant polymethylol compound was dissolved in 550 parts of methanol to obtain 1230 parts of a methanol solution of the polymethylol compound.

When part of the obtained methanol solution of the polymethylol compound was dried in a vacuum dryer at room temperature, it was confirmed that its solid content was 55.2%.

SYNTHETIC EXAMPLE 2

Into a flask equipped with a cooling tube and a stirrer, 500 parts of the methanol solution of the polymethylol compound obtained in Synthetic Example 1 and 440 parts of 2,6-xylenol were charged and dissolved uniformly at 50° C. After dissolving them uniformly, methanol was removed therefrom under reduced pressure at a temperature of 50° C. or less. Then, 8 parts of oxalic acid was added thereto and left reacting for 10 hours at 100° C. After completion of the reaction, a distillate was removed therefrom under reduced pressure of 50 mmHg at 180° C. to obtain 550 parts of a novolak resin A.

SYNTHETIC EXAMPLE 3

530 parts of a novolak resin B was obtained by faithfully following the procedure of Synthetic Example 2 except that 440 parts of 2,6-xylenol was changed to 430 parts of o-cresol.

SYNTHETIC EXAMPLE 4

Into an autoclave equipped with a thermometer, a device for introduction of nitrogen and alkylene oxide, and a stirrer, 130 parts of the novolak resin A, 2.6 parts of an aqueous 50% sodium hydroxide solution, and 100 parts of toluene/methyl isobutyl ketone (weight ratio=2/1) were charged. The air in the system chamber was replaced with nitrogen while stirring the mixture. The temperature of the mixture was then increased to 150° C. by heating and 45 parts of ethylene oxide was gradually introduced therein under pressure of 8 kg/cm$^2$ to cause reaction thereof. The reaction was continued for about 4 hours till the gauge pressure of 0.0 kg/cm$^2$ and then the solution was cooled to room temperature. To this reaction solution, 3.3 parts of an aqueous 36% hydrochloric acid solution was added and mixed therewith to neutralize sodium hydroxide. The resultant neutralized reaction product was diluted with toluene, washed with water three times, subjected to desolvation by an evaporator to obtain an ethylene oxide adduct of novolak resin A having the hydroxyl equivalent of 175 g/eq. This means that one mol of the ethylene oxide was added to one equivalent of the phenolic hydroxyl group on average.

Into a reaction vessel equipped with a stirrer, a thermometer, and an air blowing tube, 175 parts of the ethylene oxide adduct of novolak resin A obtained as above, 50 parts of acrylic acid, 3.0 parts of p-toluenesulfonic acid, 0.1 part of hydroquinone monomethyl ether, and 130 parts of toluene were charged, stirred and heated to 115° C. while blowing air thereinto. While distilling out water caused by the reaction together with toluene as an azeotropic mixture, the reaction was further continued for 4 hours. Thereafter, the reaction solution was cooled to room temperature. The obtained reaction solution was washed with an aqueous 5% NaCl solution, toluene was distilled out under reduced pressure, and diethylene glycol monoethyl ether acetate was added to the solution to obtain an acrylate resin solution having a nonvolatile content of 68%.

Next, 312 parts of the resultant acrylate resin solution, 0.1 part of hydroquinone monomethyl ether, and 0.3 part of triphenylphosphine were charged into a four-necked flask equipped with a stirrer and a reflux condenser. This mixture was heated to 110° C. and made to add 45 parts of tetrahydrophthalic anhydride and they were left reacting for 4 hours. The product was cooled and then extracted from the flask. The carboxyl group-containing photosensitive resin consequently obtained was found to have a nonvolatile content of 72% and an acid value of 65 mg KOH/g as solids. This solution of the carboxyl group-containing photosensitive resin will be referred to hereinafter as "varnish A-1".

SYNTHETIC EXAMPLE 5

Into an autoclave equipped with a thermometer, a device for introduction of nitrogen and alkylene oxide, and a stirrer, 130 parts of the novolak resin A, 2.6 parts of an aqueous 50% sodium hydroxide solution, and 100 parts of toluene/methyl isobutyl ketone (weight ratio=2/1) were charged. The air in the system chamber was replaced with nitrogen while stirring the mixture. The temperature of the mixture was then increased to 150° C. by heating and 60 parts of propylene oxide was gradually introduced therein under pressure of 8 kg/cm$^2$ to cause reaction thereof. The reaction was continued for about 4 hours till the gauge pressure of 0.0 kg/cm$^2$ and then the solution was cooled to room temperature. To this reaction solution, 3.3 parts of an aqueous 36% hydrochloric acid solution was added and mixed therewith to neutralize sodium hydroxide. The resultant neutralized reaction product was diluted with toluene, washed with water three times, subjected to desolvation by an evaporator to obtain a propylene oxide adduct of novolak resin A having the hydroxyl equivalent of 189 g/eq. This means that one mol of the propylene oxide was added to one equivalent of the phenolic hydroxyl group on average.

Into a reaction vessel equipped with a stirrer, a thermometer, and an air blowing tube, 189 parts of the propylene oxide adduct of novolak resin A obtained as above, 36 parts of acrylic acid, 3.0 parts of p-toluenesulfonic acid, 0.1 part of hydroquinone monomethyl ether, and 140 parts of toluene were charged, stirred and heated to 115° C. while blowing air thereinto. While distilling out water caused by the reaction together with toluene as an azeotropic mixture, the reaction was further continued for 4 hours. Thereafter, the reaction solution was cooled to room temperature. The obtained reaction solution was washed with an aqueous 5% NaCl solution, toluene was distilled out under reduced pressure, and diethylene glycol monoethyl ether acetate was added to the solution to obtain an acrylate resin solution having a nonvolatile content of 67%.

Next, 322 parts of the resultant acrylate resin solution, 0.1 part of hydroquinone monomethyl ether, and 0.3 part of triphenylphosphine were charged into a four-necked flask equipped with a stirrer and a reflux condenser. This mixture was heated to 110° C. and made to add 60 parts of tetrahydrophthalic anhydride and they were left reacting for 4 hours. The product was cooled and then extracted from the flask. The carboxyl group-containing photosensitive resin consequently obtained was found to have a nonvolatile content of 72% and an acid value of 81 mg KOH/g as solids. This solution of the carboxyl group-containing photosensitive resin will be referred to hereinafter as "varnish A-2".

SYNTHETIC EXAMPLE 6

Into an autoclave equipped with a thermometer, a device for introduction of nitrogen and alkylene oxide, and a stirrer, 120 parts of the novolak resin B, 2.6 parts of an aqueous 50% sodium hydroxide solution, and 100 parts of toluene/methyl isobutyl ketone (weight ratio=2/1) were charged. The air in the system chamber was replaced with nitrogen while stirring the mixture. The temperature of the mixture was then increased to 150° C. by heating and 45 parts of ethylene oxide was gradually introduced therein under pressure of 8 kg/cm$^2$ to cause reaction thereof. The reaction was continued for about 4 hours till the gauge pressure of 0.0 kg/cm$^2$ and then the solution was cooled to room temperature. To this reaction solution, 3.3 parts of an aqueous 36% hydrochloric acid solution was added and mixed therewith to neutralize sodium hydroxide. The resultant neutralized reaction product was diluted with toluene, washed with water three times, subjected to desolvation by an evaporator to obtain an ethylene oxide adduct of novolak resin B having the hydroxyl equivalent of 165 g/eq. This means that one mol of the ethylene oxide was added to one equivalent of the phenolic hydroxyl group on average.

Into a reaction vessel equipped with a stirrer, a thermometer, and an air blowing tube, 165 parts of the ethylene oxide adduct of novolak resin B obtained as above, 36 parts of acrylic acid, 3.0 parts of p-toluenesulfonic acid, 0.1 part of hydroquinone monomethyl ether, and 130 parts of toluene were charged, stirred and heated to 115° C. while blowing air thereinto. While distilling out water caused by the reaction together with toluene as an azeotropic mixture, the reaction was further continued for 4 hours. Thereafter, the reaction solution was cooled to room temperature. The obtained reaction solution was washed with an aqueous 5% NaCl solution, toluene was distilled out under reduced pressure, and diethylene glycol monoethyl ether acetate was added to the solution to obtain an acrylate resin solution having a nonvolatile content of 66%.

Next, 289 parts of the resultant acrylate resin solution, 0.1 part of hydroquinone monomethyl ether, and 0.3 part of triphenylphosphine were charged into a four-necked flask equipped with a stirrer and a reflux condenser. This mixture was heated to 110° C. and made to add 60 parts of tetrahydrophthalic anhydride and they were left reacting for 4 hours. The product was cooled and then extracted from the flask. The carboxyl group-containing photosensitive resin consequently obtained was found to have a nonvolatile content of 72% and an acid value of 89 mg KOH/g as solids. This solution of the carboxyl group-containing photosensitive resin will be referred to hereinafter as "varnish A-3".

COMPARATIVE SYNTHETIC EXAMPLE 1

Into an autoclave equipped with a thermometer, a device for introduction of nitrogen and alkylene oxide, and a stirrer, 106 parts of a novolak type phenolic resin (Shonol BRG-558 manufactured by Showa Highpolymer Co., Ltd.), 2.6 parts of an aqueous 50% sodium hydroxide solution, and 100 parts of toluene/methyl isobutyl ketone (weight ratio=2/1) were charged. The air in the system chamber was replaced with nitrogen while stirring the mixture. The temperature of the mixture was then increased to 150° C. by heating and 60 parts of propylene oxide was gradually introduced therein under pressure of 8 kg/cm² to cause reaction thereof. The reaction was continued for about 4 hours till the gauge pressure of 0.0 kg/cm² and then the solution was cooled to room temperature. To this reaction solution, 3.3 parts of an aqueous 36% hydrochloric acid solution was added and mixed therewith to neutralize sodium hydroxide. The resultant neutralized reaction product was diluted with toluene, washed with water three times, subjected to desolvation by an evaporator to obtain a propylene oxide adduct of novolak type phenolic resin having the hydroxyl equivalent of 164 g/eq. This means that one mol of the propylene oxide was added to one equivalent of the phenolic hydroxyl group on average.

Into a reaction vessel equipped with a stirrer, a thermometer, and an air blowing tube, 164 parts of the propylene oxide adduct of the novolak type phenolic resin obtained as above, 36 parts of acrylic acid, 3.0 parts of p-toluenesulfonic acid, 0.1 part of hydroquinone monomethyl ether, and 130 parts of toluene were charged, stirred and heated to 115° C. while blowing air thereinto. While distilling out water caused by the reaction together with toluene as an azeotropic mixture, the reaction was further continued for 4 hours. Thereafter, the reaction solution was cooled to room temperature. The obtained reaction solution was washed with an aqueous 5% NaCl solution, toluene was distilled out under reduced pressure, and diethylene glycol monoethyl ether acetate was added to the solution to obtain an acrylate resin solution having a nonvolatile content of 64%.

Next, 298 parts of the resultant acrylate resin solution, 0.1 part of hydroquinone monomethyl ether, and 0.3 part of triphenylphosphine were charged into a four-necked flask equipped with a stirrer and a reflux condenser. This mixture was heated to 110° C. and made to add 60 parts of tetrahydrophthalic anhydride and they were left reacting for 4 hours. The product was cooled and then extracted from the flask. The carboxyl group-containing photosensitive resin consequently obtained was found to have a nonvolatile content of 70% and an acid value of 89 mg KOH/g as solids. This solution of the carboxyl group-containing photosensitive resin will be referred to hereinafter as "varnish R-1".

COMPARATIVE SYNTHETIC EXAMPLE 2

Into an autoclave equipped with a thermometer, a device for introduction of nitrogen and alkylene oxide, and a stirrer, 115 parts of a cresol novolak type phenolic resin (Shonol CRG-951 manufactured by Showa Highpolymer Co., Ltd.), 2.6 parts of an aqueous 50% sodium hydroxide solution, and 100 parts of toluene/methyl isobutyl ketone (weight ratio=2/1) were charged. The air in the system chamber was replaced with nitrogen while stirring the mixture. The temperature of the mixture was then increased to 150° C. by heating and 45 parts of ethylene oxide was gradually introduced therein under pressure of 8 kg/cm² to cause reaction thereof. The reaction was continued for about 4 hours till the gauge pressure of 0.0 kg/cm² and then the solution was cooled to room temperature. To this reaction solution, 3.3 parts of an aqueous 36% hydrochloric acid solution was added and mixed therewith to neutralize sodium hydroxide. The resultant neutralized reaction product was diluted with toluene, washed with water three times, subjected to desolvation by an evaporator to obtain an ethylene oxide adduct of cresol novolak type phenolic resin having the hydroxyl equivalent of 160 g/eq. This means that one mol of the ethylene oxide was added to one equivalent of the phenolic hydroxyl group on average.

Into a reaction vessel equipped with a stirrer, a thermometer, and an air blowing tube, 160 parts of the ethylene oxide adduct of the cresol novolak type phenolic resin obtained as above, 36 parts of acrylic acid, 3.0 parts of p-toluenesulfonic acid, 0.1 part of hydroquinone monomethyl ether, and 130 parts of toluene were charged, stirred and heated to 115° C. while blowing air thereinto. While distilling out water caused by the reaction together with toluene as an azeotropic mixture, the reaction was further continued for 4 hours. Thereafter, the reaction solution was cooled to room temperature. The obtained reaction solution was washed with an aqueous 5% NaCl solution, toluene was distilled out under reduced pressure, and diethylene glycol monoethyl ether acetate was added to the solution to obtain an acrylate resin solution having a nonvolatile content of 64%.

Next, 293 parts of the resultant acrylate resin solution, 0.1 part of hydroquinone monomethyl ether, and 0.3 part of triphenylphosphine were charged into a four-necked flask equipped with a stirrer and a reflux condenser. This mixture was heated to 110° C. and made to add 60 parts of tetrahydrophthalic anhydride and they were left reacting for 4 hours. The product was cooled and then extracted from the flask. The carboxyl group-containing photosensitive resin consequently obtained was found to have a nonvolatile content of 70% and an acid value of 91 mg KOH/g as solids. This solution of the carboxyl group-containing photosensitive resin will be referred to hereinafter as "varnish R-2".

COMPARATIVE SYNTHETIC EXAMPLE 3

Into a flask equipped with a gas introduction tube, a stirrer, a cooling tube, and a thermometer, 210 parts of a cresol novolak type epoxy resin (EPICLON N680 manufactured by DIC Corporation, epoxy equivalent: 210), 0.1 part of hydroquinone monomethyl ether, and 50 parts of ethylcarbitol acetate were charged and they were dissolved at 100° C. while stirring them under air stream. Then, 70 parts of acrylic acid and 0.65 part of triphenylphosphine were added to the solution. The resultant mixture in the flask was heated to 120° C. and left reacting for 6 hours. The reaction product in the flask was cooled to 80° C. and made to add 90 parts of ethylcarbitol acetate and 76 parts of tetrahydrophthalic anhydride and they were heated to 100° C. while stirring and left reacting for 3 hours. The product was cooled and then extracted from the flask. The carboxyl group-containing photosensitive resin consequently obtained was found to have a nonvolatile content of 70% and an acid value of 87 mg KOH/g as solids. This solution of the carboxyl group-containing photosensitive resin will be referred to hereinafter as "varnish R-3".

EXAMPLES 1 TO 9 AND COMPARATIVE EXAMPLES 1 TO 3

By using the resin solutions obtained in the synthetic examples mentioned above, the components shown in Table 1 accounting for varying ratios (in parts by weight) of combination shown in Table 1 were compounded, preliminarily mixed with an agitator, and then kneaded with a three-roll mill to obtain photosensitive resin compositions for a solder resist. The degree of dispersion of particles in each resultant photosensitive resin composition determined by the grain size measurement with a grindometer manufactured by ERICHSEN GmbH was not more than 15 μm.

TABLE 1

| Components (parts by weight) | | Examples | | | | | | | | | Comp. Examples | | |
|---|---|---|---|---|---|---|---|---|---|---|---|---|---|
| | | 1 | 2 | 3 | 4 | 5 | 6 | 7 | 8 | 9 | 1 | 2 | 3 |
| Varnish | A-1 | 139 | 139 | | | | | | | | | | |
| | A-2 | | | 139 | 139 | | | 97 | 97 | 111 | | | |
| | A-3 | | | | | 139 | 139 | | | | | | |
| | R-1 | | | | | | | 42 | 42 | | 143 | | |
| | R-2 | | | | | | | | | | | 143 | |
| | R-3 | | | | | | | | | 29 | | | 143 |
| Photopoly- merization initiator | (B-1)*[1] | 15 | | | | | | | | | | | |
| | (B-2)*[2] | 1 | | | | | | | | | | | |
| | (B-3)*[3] | | 1.5 | 1.5 | 1.5 | 1.5 | 1.5 | 1.5 | 1.5 | 1.5 | 1.5 | 1.5 | 1.5 |
| Thermo- setting component | (C-1)*[4] | 30 | 30 | 27.5 | 30 | 27.5 | 30 | 27.5 | 30 | 30 | 30 | 30 | 30 |
| | (C-2)*[5] | 20 | 20 | 10 | 20 | 10 | 20 | 10 | 20 | 20 | 20 | 20 | 20 |
| | (C-2)*[6] | | | 12.5 | | 12.5 | | 12.5 | | | | | |
| Melamine | | 3.0 | 3.0 | 3.0 | 3.0 | 3.0 | 3.0 | 3.0 | 3.0 | 3.0 | 3.0 | 3.0 | 3.0 |
| Colorant*[7] | | 0.3 | 0.3 | 0.3 | 0.3 | 0.3 | 0.3 | 0.3 | 0.3 | 0.3 | 0.3 | 0.3 | 0.3 |
| Colorant*[8] | | 0.8 | 0.8 | 0.8 | 0.8 | 0.8 | 0.8 | 0.8 | 0.8 | 0.8 | 0.8 | 0.8 | 0.8 |
| Barium sulfate*[9] | | 100 | 100 | 100 | 100 | 100 | 100 | 100 | 100 | 100 | 100 | 100 | 100 |
| Organic solvent*[10] | | 5 | 5 | 5 | 5 | 5 | 5 | 5 | 5 | 5 | 5 | 5 | 5 |
| DPHA*[11] | | 17.5 | 17.5 | 17.5 | 17.5 | 17.5 | 17.5 | 17.5 | 17.5 | 17.5 | 17.5 | 17.5 | 17.5 |
| Silicone-based anti-foaming agent | | 3 | 3 | 3 | 3 | 3 | 3 | 3 | 3 | 3 | 3 | 3 | 3 |

Remarks
*[1] 2-Methyl-1-[4-(methylthio)phenyl]-2-morpholinopropan-1-one (IRGACURE 907 produced by BASF Japan Ltd.)
*[2] 2,4-Diethyl thioxanthone (KAYACURE DETX-S produced by Nippon Kayaku Co., Ltd.)
*[3] Ethanone, 1-[9-ethyl-6-(2-methylbenzoyl)-9H-carbazole-3-yl]-1,1-(O-acetyloxime) (IRGACURE OXE 02 produced by BASF Japan Ltd.)
*[4] Biphenyl novolak type epoxy resin (NC-3000HCA75 produced by Nippon Kayaku Co., Ltd.)
*[5] Bisphenol type epoxy resin (YSLV-80XY produced by Shinnittetsu Chemical Co., Ltd.)
*[6] EPOLEAD PB3600 (produced by Daicel Chemical Industries Ltd.)
*[7] C.I. Pigment Blue 15:3
*[8] C.I. Pigment Yellow 147
*[9] B-30 (produced by Sakai Chemical Industry Co., Ltd.)
*[10] Diethylene glycol monoethyl ether acetate
*[11] Dipentaerythritol pentaacrylate The assessments of performance and characteristics of the compositions of Examples and Comparative Examples shown in Table 1 were performed by the following evaluation methods. The results of evaluation are shown in Table 2.

Evaluation of Performance:

<Optimum Exposure Dose>

After a substrate having a circuit pattern of copper of 18 μm thickness formed in advance thereon was subjected to a copper surface roughening treatment (MECetchBOND CZ-8100 produced by MEC COMPANY LTD.), washed with water, and dried, each of the photocurable and thermosetting resin compositions of Examples and Comparative Examples shown in Table 1 was applied by a screen printing method onto the substrate. The coating film on the substrate was dried in a hot air circulating drying oven at 80° C. for 30 minutes to obtain a dried coating film of about 20 μm in thickness. Thereafter, the coating film was exposed to light through a step tablet (KODAK No. 2) by the use of an exposure device equipped with high-pressure mercury vapor lamps and developed for 90 seconds with an aqueous 1% sodium carbonate solution of 30° C. under a spraying pressure of 0.2 MPa. The exposure dose by which seven patterns of the step tablet remained after developing was rated as the optimum exposure dose or optimum irradiation dose.

<Tackiness>

Each of the photocurable resin compositions was applied by a screen printing method onto the entire surface of a copper foil-laminated substrate having a prescribed pattern formed in advance thereon to form a coating film. The coating film on the substrate was dried in a hot air circulating drying oven at 80° C. for 30 minutes and left cooling to room temperature. A negative film made from PET (polyethylene terephthalate) was superposed on this substrate and pressed fixedly thereon under reduced pressure conditions for 1 minute by the use of HMW-GW20 manufactured by ORC Manufacturing Co., Ltd. Thereafter, the adhesion state of the film when the negative film is separated from the substrate was evaluated on the following criterion.

○: When separating the negative film, there is resistance slightly, but no discernible mark is observed in the coating film.

Δ: When separating the negative film, there is resistance and a slight mark is observed in the coating film.

X: When separating the negative film, there is considerable resistance and clear marks remain in the coating film.

<Maximum Developable Life>

Each of the compositions of Examples and Comparative Examples shown in Table 1 was applied by a screen printing method onto the entire surface of a copper foil-laminated substrate having a prescribed pattern formed in advance thereon so as to be a dried film thickness of about 20 μm. The coating films on the substrates were dried at 80° C., and then the substrates were taken out every 10 minutes from 20 minutes to 80 minutes and left cooling to room temperature. These substrates were developed for 90 seconds with an aqueous 1% sodium carbonate solution of 30° C. under a spraying pressure of 0.2 MPa. The maximally permissible drying time in which any dried coating film does not remain on the substrate was rated as the maximum developable life.

Evaluation of Characteristics:

Each of the compositions of Examples and Comparative Examples shown in Table 1 was applied by a screen printing method onto the entire surface of a copper foil-laminated substrate having a prescribed pattern formed in advance thereon so as to be a dried film thickness of about 20 μm. The coating film on the substrates was dried at 80° C. for 30 minutes and left cooling to room temperature. This substrate was exposed to light according to a solder resist pattern with the optimum exposure dose by the use of an exposure device equipped with high-pressure mercury vapor lamps and developed for 90 seconds with an aqueous 1% sodium carbonate solution of 30° C. under a spraying pressure of 0.2 MPa to obtain a resist pattern. The coating film on this substrate was cured by exposing to UV light under the conditions of accumulated exposure dose of 1,000 mJ/cm$^2$ by the use of a UV conveyor furnace and then heating at 150° C. for 60 minutes. The characteristics of the obtained printed substrate (test substrate) were evaluated in the following manner.

<Acid Resistance>

The test substrate mentioned above was immersed in an aqueous 10 vol. % $H_2SO_4$ solution for 30 minutes at room temperature, and the cured film conditions such as the exudation or dissolving out of the film were visually examined. Further, the separation of the cured film was examined by a peeling test with an adhesive tape.

◯: Absence of discernible change

Δ: Very slight presence of change

X: Occurrence of blister or swell or separation of cured film

<Alkali Resistance>

The test substrate mentioned above was immersed in an aqueous 10 vol. % NaOH solution for 30 minutes at room temperature, and the cured film conditions such as the exudation or dissolving out of the film were visually examined. Further, the separation of the cured film was examined by a peeling test with an adhesive tape.

◯: Absence of discernible change

Δ: Very slight presence of change

X: Occurrence of blister or swell or separation of cured film

<Resistance to Soldering Heat>

A test substrate coated with a rosin-based flux was repeatedly immersed in a solder bath kept at 260° C. and visually examined the blister or separation of the resist layer after washing the flux with a denatured alcohol. The criterion for evaluation is as follows:

◯: Separation of the resist layer is not found even when the immersion for 10 seconds is repeated three times or more.

Δ: Slight separation of the resist layer is found when the immersion for 10 seconds is repeated three times or more.

X: Blister and separation of the resist layer are found when the immersion for 10 seconds is repeated three times or less.

<Resistance to Electroless Gold Plating>

Each test substrate was plated successively in an electroless nickel plating bath and an electroless gold plating bath, both available in the market, under the conditions of 5 μm of nickel and 0.05 μm of gold. Then, the plated test substrate was examined to determine whether or not the resist layer was separated and whether or not the resist layer had been infiltrated with the plating solution. Thereafter, the test substrate was subjected to a peeling test with an adhesive tape to evaluate the separation of the resist layer. The criterion for evaluation is as follows:

◯: Infiltration with the plating solution and whitening of the resist layer are not observed after plating and no peeling of the resist layer is observed after the tape peeling test.

Δ: Infiltration with the plating solution and whitening of the resist layer are observed after plating, but no peeling of the resist layer is observed after the tape peeling test.

X: Infiltration with the plating solution and whitening of the resist layer are observed after plating, and peeling of the resist layer is observed after the tape peeling test.

<PCT Resistance>

The test substrate which had been subjected to the electroless gold plating treatment in the same manner as the test for electroless gold plating mentioned above was treated in a PCT apparatus (HAST SYSTEM TPC-412MD manufactured by ESPEC Corp.) for various periods of time under the conditions of 121° C., saturation, and 0.2 MPa, and the state of the cured film was examined to evaluate the PCT resistance. The criterion for evaluation is as follows:

◯: No discernible blister, separation, discoloration, or melting of the cured film is observed even when the test is performed for 240 hours.

Δ: No discernible blister, separation, discoloration, or melting of the cured film is observed at the time of a lapse of 168 hours of the testing time, but occurrence of either of blister, separation, discoloration, or melting of the cured film is observed at the time of a lapse of 240 hours.

X: Blister, separation, discoloration, and melting of the cured film are observed at the time of a lapse of 168 hours of the testing time.

<Thermal Shock Resistance>

A test substrate having a solder resist cured film in which a pattern of holes in the shape of square and circle is formed was prepared. The resultant test substrate was placed in a thermal shock tester (manufactured by ETAC Engineering Co., Ltd.) and subjected to the heat cycle test under the conditions of 1,000 cycles between −55° C.×30 minutes and 150° C.×30 minutes. After completion of this test, the cured film which had undergone this treatment was visually observed to investigate whether or not the cracks occurred. The criterion for evaluation is as follows:

◯: The rate of occurrence of cracks is less than 30%.

Δ: The rate of occurrence of cracks is 30 to 50%.

X: The rate of occurrence of cracks is more than 50%.

<HAST Characteristics>

The solder resist cured film was formed on a BT (bismaleimide triazine) substrate having a comb electrode (line/space=30 μm/30 μm) formed therein to prepare a test substrate. This test substrate was placed in a thermo-hygrostat kept under the conditions of 130° C. and the humidity of 85% and the voltage of 5.5 V was applied to the electrode. The test substrate was left standing for various periods of time to perform the HAST test (highly accelerated stress test) in a chamber. The value of insulation resistance in the chamber after a lapse of various periods of time was evaluated in accordance with the following criterion.

◯: More than $10^8 \Omega$ after a lapse of 240 hours

X: Not more than $10^8 \Omega$ at the time of a lapse of 240 hours

TABLE 2

| Properties | Examples | | | | | | | | | Comp. Examples | | |
|---|---|---|---|---|---|---|---|---|---|---|---|---|
| | 1 | 2 | 3 | 4 | 5 | 6 | 7 | 8 | 9 | 1 | 2 | 3 |
| Optimum exposure dose (mJ/cm$^2$) | 400 | 180 | 160 | 180 | 160 | 180 | 160 | 180 | 180 | 180 | 180 | 200 |
| Tackiness | ◯ | ◯ | Δ | ◯ | Δ | ◯ | Δ | ◯ | ◯ | X | X | Δ |

TABLE 2-continued

| Properties | Examples | | | | | | | | | Comp. Examples | | |
|---|---|---|---|---|---|---|---|---|---|---|---|---|
| | 1 | 2 | 3 | 4 | 5 | 6 | 7 | 8 | 9 | 1 | 2 | 3 |
| Maximum developable life | 50 | 50 | 70 | 60 | 70 | 60 | 70 | 60 | 60 | 70 | 70 | 60 |
| Acid resistance | ○ | ○ | ○ | ○ | ○ | ○ | ○ | ○ | ○ | ○ | ○ | ○ |
| Alkali resistance | ○ | ○ | ○ | ○ | ○ | ○ | ○ | ○ | ○ | ○ | ○ | ○ |
| Resistance to soldering heat | ○ | ○ | ○ | ○ | ○ | ○ | ○ | ○ | ○ | ○ | ○ | ○ |
| Resistance to electroless gold plating | ○ | ○ | ○ | ○ | ○ | ○ | ○ | ○ | ○ | ○ | ○ | Δ |
| PCT resistance | ○ | ○ | ○ | ○ | ○ | ○ | ○ | ○ | Δ | Δ | Δ | X |
| Thermal shock resistance | Δ | Δ | ○ | Δ | ○ | Δ | ○ | Δ | Δ | X | X | X |
| Electrical characteristics | ○ | ○ | ○ | ○ | ○ | ○ | ○ | ○ | ○ | ○ | ○ | X |

EXAMPLES 10 TO 17 AND COMPARATIVE EXAMPLES 4 TO 6

Each of the compositions of Examples 1-8 and Comparative Examples 1-3 prepared by compounding relevant components at proportions shown in Table 1 was diluted with methyl ethyl ketone, applied to a PET film, and then dried at 80° C. for 30 minutes, thereby forming a layer of the photosensitive resin composition of 20 μm in thickness thereon. Thereafter, a cover film was laminated thereon to prepare a dry film. They correspond to Examples 10 to 17 and Comparative Examples 4 to 6, respectively.

<Evaluation of Dry Film>

The cover film was separated from the dry film obtained as described above, and the photosensitive dry film was thermally laminated onto a copper foil-laminated substrate having a prescribed pattern formed in advance thereon and then exposed to light under the same conditions as those used for Evaluation of Characteristics of a coating film of Examples mentioned above. After exposure to light, the carrier film was removed from the substrate, and then the photo-cured film was developed for 90 seconds with an aqueous 1 wt. % sodium carbonate solution of 30° C. under the condition of a spraying pressure of 0.2 MPa to obtain a resist pattern. The photo-cured film on this substrate was cured by exposing to UV light under the conditions of accumulated exposure dose of 1,000 mJ/cm$^2$ by the use of a UV conveyor furnace and then heating at 150° C. for 60 minutes. The obtained test substrate having the cured film was examined for various characteristics in the same testing method and the same evaluation method as described above. The results are shown in Table 3.

TABLE 3

| Properties | Examples | | | | | | | | Comp. Examples | | |
|---|---|---|---|---|---|---|---|---|---|---|---|
| | 10 | 11 | 12 | 13 | 14 | 15 | 16 | 17 | 4 | 5 | 6 |
| Optimum exposure dose (mJ/cm$^2$) | 400 | 200 | 180 | 200 | 180 | 180 | 180 | 180 | 180 | 180 | 200 |
| Acid resistance | ○ | ○ | ○ | ○ | ○ | ○ | ○ | ○ | ○ | ○ | ○ |
| Alkali resistance | ○ | ○ | ○ | ○ | ○ | ○ | ○ | ○ | ○ | ○ | ○ |
| Resistance to soldering heat | ○ | ○ | ○ | ○ | ○ | ○ | ○ | ○ | ○ | ○ | ○ |
| Resistance to electroless gold plating | ○ | ○ | ○ | ○ | ○ | ○ | ○ | ○ | ○ | ○ | Δ |
| PCT resistance | ○ | ○ | ○ | ○ | ○ | ○ | ○ | ○ | Δ | Δ | X |
| Thermal shock resistance | Δ | Δ | ○ | Δ | ○ | Δ | ○ | Δ | X | X | X |
| Electrical characteristics | ○ | ○ | ○ | ○ | ○ | ○ | ○ | ○ | ○ | ○ | X |

As being clearly noted from Tables 2 and 3, the cured products of the compositions obtained by the use of the carboxyl group-containing photosensitive resin of the present invention excelled in tack-free touch and also in other properties such as heat resistance, water resistance, adhesiveness, and reliability. On the contrary, the cured products of the compositions obtained by the use of the carboxyl group-containing photosensitive resins of the comparative examples were deficient in either property of drying characteristics, heat resistance, water resistance, adhesiveness, or reliability.

Since the carboxyl group-containing photosensitive resin of the present invention and the curable resin composition containing the same are capable of forming a cured film excelling in various properties such as adhesiveness, resistance to soldering heat, resistance to moisture absorption, PCT resistance, resistance to electroless gold plating, flexing resistance, folding endurance, flexibility, warpage, and electrical insulating properties at a low cost with high productivity, they are not only usable as an ultraviolet-curable type printing ink which is cured by the use of the active energy rays or other usage but also useful as a solder resist, an etching resist, a plating resist and an interlaminar insulating material to be used for the manufacture of a printed circuit board.

Further, since the curable resin composition of the present invention exhibits little warpage after curing, it allows easy mounting of parts or chips on a flexible printed circuit board or a tape carrier package. Moreover, it is possible to produce the composition at a low cost in comparison with a liquid polyimide ink heretofore used.

While certain specific embodiments and working examples have been disclosed herein, the invention may be embodied in other specific forms without departing from the spirit or essential characteristics thereof. The described embodiments and examples are therefore to be considered in all respects as illustrative and not restrictive, the scope of the invention being indicated by the appended claims rather than by the foregoing description and all changes which come within the meaning and the range of equivalency of the claims are, therefore, intended to be embraced therein.

The disclosure in Japanese Patent Application No. 2010-205680 of Sep. 14, 2010 is incorporated here by reference. This Japanese Patent Application describes the invention described hereinabove and claimed in the claims appended hereinbelow and provides the basis for a claim of priority for the instant invention under 35 U.S.C. 119.

What is claimed is:

1. A carboxyl group-containing photosensitive resin obtained by reacting an α,β-ethylenically unsaturated group-containing monocarboxylic acid (c) with a phenolic compound (a) containing a structure represented by the following general formula (I) and having at least two phenolic hydroxyl groups in its molecule, wherein part or the whole of the phenolic hydroxyl groups being modified into an oxyalkyl group, and further reacting a polybasic acid anhydride (d) with the resultant reaction product;

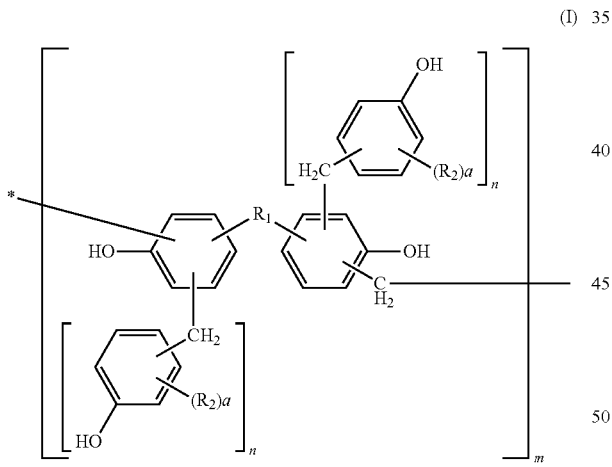

wherein, $R_1$ represents a hydrocarbon radical of 1 to 11 carbon atoms, $R_2$ represents a hydrocarbon radical of 1 to 11 carbon atoms, "a" represents an integer of 0 to 3, "n" represents an integer of 1 to 2, "m" represents an integer of 1 to 10, and said phenolic compound (a) is a compound obtained by the condensation reaction of a polyhydroxymethylated bisphenol A or bisphenol F with a phenolic compound.

2. An alkali-developable, curable resin composition, comprising:

(A) a carboxyl group-containing photosensitive resin obtained by reacting an α,β-ethylenically unsaturated group-containing monocarboxylic acid (c) with a phenolic compound (a) containing a structure represented by the following general formula (I) and having at least two phenolic hydroxyl groups in its molecule, wherein part or the whole of the phenolic hydroxyl groups being modified into an oxyalkyl group, and further reacting a polybasic acid anhydride (d) with the resultant reaction product;

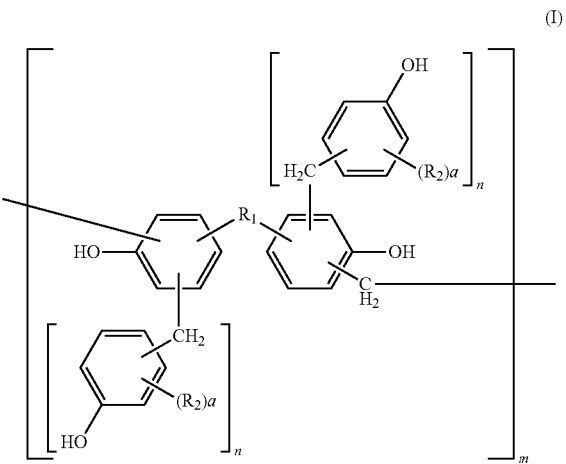

wherein, $R_1$ represents a hydrocarbon radical of 1 to 11 carbon atoms, $R_2$ represents a hydrocarbon radical of 1 to 11 carbon atoms, "a" represents an integer of 0 to 3, "n" represents an integer of 1 to 2, "m" represents an integer of 1 to 10, and said phenolic compound (a) is a compound obtained by the condensation reaction of a polyhydroxymethylated bisphenol A or bisphenol F with a phenolic compound, (B) a photopolymerization initiator, and (C) a thermosetting component.

3. A photocurable and thermosetting film obtained by applying the curable resin composition according to claim 2 on a film and drying the curable resin composition according to claim 2.

4. A cured product obtained by curing the curable resin composition according to claim 2 by either one or both treatments of irradiation of active energy rays and heating.

5. The cured product according to claim 4, wherein said curable resin composition is a photocurable and thermosetting film obtained by applying the curable resin composition on a film and drying the curable resin composition.

6. A printed circuit board provided with a cured product obtained by curing the curable resin composition according to claim 2 by either one or both treatments of irradiation of active energy rays and heating.

7. The printed circuit board according to claim 6, wherein said curable resin composition is a photocurable and thermosetting film obtained by applying the curable resin composition on a film and drying the curable resin composition.

* * * * *